United States Patent
Nishimura et al.

(10) Patent No.: US 7,108,954 B2
(45) Date of Patent: *Sep. 19, 2006

(54) RADIATION-SENSITIVE COMPOSITION CHANGING IN REFRACTIVE INDEX AND METHOD OF CHANGING REFRACTIVE INDEX

(75) Inventors: Isao Nishimura, Tokyo (JP); Nobuo Bessho, Tokyo (JP); Atsushi Kumano, Tokyo (JP); Tsutomu Shimokawa, Tokyo (JP); Kenji Yamada, Kyoto (JP)

(73) Assignee: JSR Corporation, Tokyo (JP)

( * ) Notice: Subject to any disclaimer, the term of this patent is extended or adjusted under 35 U.S.C. 154(b) by 195 days.

This patent is subject to a terminal disclaimer.

(21) Appl. No.: 10/415,102

(22) PCT Filed: Dec. 6, 2001

(86) PCT No.: PCT/JP01/10695

§ 371 (c)(1),
(2), (4) Date: Apr. 30, 2003

(87) PCT Pub. No.: WO02/48264

PCT Pub. Date: Jun. 20, 2002

(65) Prior Publication Data

US 2004/0013972 A1    Jan. 22, 2004

(30) Foreign Application Priority Data

Dec. 11, 2000 (JP) ............................. 2000-375523
Jan. 16, 2001 (JP) ............................. 2001-007554
Feb. 6, 2001 (JP) ............................. 2001-029226
Feb. 9, 2001 (JP) ............................. 2001-034028

(51) Int. Cl.
*G03F 7/004* (2006.01)
*G03F 7/20* (2006.01)

(52) U.S. Cl. .................. 430/270.1; 430/280.1; 430/281.1; 430/311

(58) Field of Classification Search ............ 430/280.1, 430/281.1, 311, 270.1
See application file for complete search history.

(56) References Cited

U.S. PATENT DOCUMENTS

| 3,894,253 A | 7/1975 | Willyoung et al. |
| 3,940,507 A | 2/1976 | Fech, Jr. et al. |
| 4,168,274 A | 9/1979 | Hildon et al. |
| 4,247,611 A | 1/1981 | Sander et al. |

(Continued)

FOREIGN PATENT DOCUMENTS

EP    0 041 657    12/1981

(Continued)

OTHER PUBLICATIONS

English language abstract of JP 2002-296402.*

(Continued)

*Primary Examiner*—Amanda Walke
(74) *Attorney, Agent, or Firm*—Oblon, Spivak, McClelland, Maier & Neustadt, P.C.

(57) ABSTRACT

A radiation sensitive refractive index changing composition comprising (A) a decomposable compound, (B) a non-decomposable compound having a higher refractive index than the decomposable compound (A), (C) a radiation sensitive decomposer and (D) a stabilizer. By exposing this composition to radiation through a pattern mask, the above components (C) and (A) of an exposed portion decompose to create a refractive index difference between the exposed portion and an unexposed portion, thereby forming a pattern having different refractive indices.

16 Claims, 1 Drawing Sheet

U.S. PATENT DOCUMENTS

Figure 1:
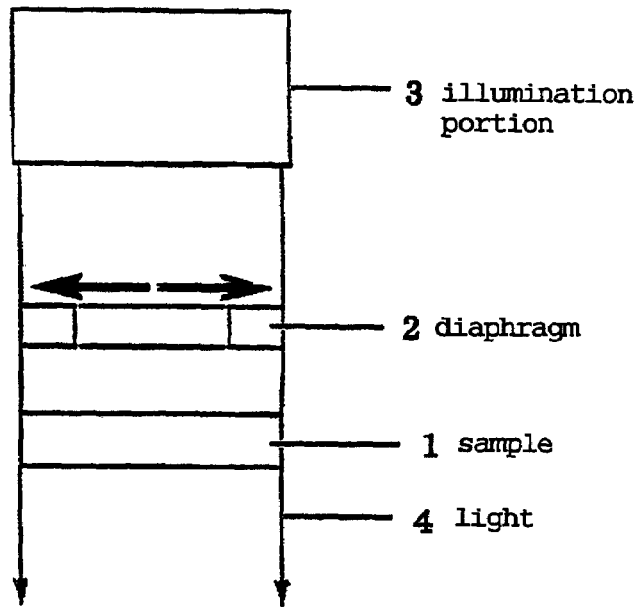

| | | | |
|---|---|---|---|
| 5,627,010 A | 5/1997 | Pai et al. | |
| 5,635,338 A * | 6/1997 | Joshi et al. | 430/325 |
| 5,958,648 A | 9/1999 | Nishimura et al. | |
| 6,399,267 B1 | 6/2002 | Nishimura et al. | |
| 6,787,289 B1 * | 9/2004 | Yamada et al. | 430/281.1 |
| 6,828,078 B1 * | 12/2004 | Nishimura et al. | 430/270.1 |
| 2003/0171468 A1 * | 9/2003 | Nishimura et al. | 524/261 |
| 2004/0005506 A1 * | 1/2004 | Nishimura et al. | 430/17 |

FOREIGN PATENT DOCUMENTS

| | | |
|---|---|---|
| EP | 0 225 454 | 6/1987 |
| JP | 45-11712 | 4/1970 |
| JP | 55-9433 | 3/1980 |
| JP | 56-17345 | 2/1981 |
| JP | 57-31674 | 2/1982 |
| JP | 57-40526 | 3/1982 |
| JP | 58-69217 | 4/1983 |
| JP | 60-37549 | 2/1985 |
| JP | 62-25705 | 2/1987 |
| JP | 62-136638 | 6/1987 |
| JP | 62-190211 | 8/1987 |
| JP | 63-97945 | 4/1988 |
| JP | 64-003647 | 1/1989 |
| JP | 2-146544 | 6/1990 |
| JP | 3-192310 | 8/1991 |
| JP | 4-107460 | 4/1992 |
| JP | 4-303843 | 10/1992 |
| JP | 4-330444 | 11/1992 |
| JP | 5-60931 | 3/1993 |
| JP | 5-117392 | 5/1993 |
| JP | 6-75377 | 3/1994 |
| JP | 7-56026 | 3/1995 |
| JP | 7-56354 | 3/1995 |
| JP | 7-92313 | 4/1995 |
| JP | 7-244378 | 9/1995 |
| JP | 8-336911 | 12/1996 |
| JP | 8-337609 | 12/1996 |
| JP | 9-133813 | 5/1997 |
| JP | 9-178901 | 7/1997 |
| JP | 2002296402 A * | 10/2002 |
| WO | 93/19505 | 9/1993 |
| WO | 94/04949 | 3/1994 |
| WO | 97/44714 | 11/1997 |
| WO | WO 9744714 A1 * | 11/1997 |

OTHER PUBLICATIONS

MACROMOLECULES, vol. 29, pp. 5529-5534 1996.
POLYMER, vol. 17, pp. 1086-1090 1976.
Macromol. Chem. Rapid Commun., vol. 7, pp. 121-126 1986.
Polymer Sci., vol. A-1, pp. 2375-2381 1970.
Macromol. Chem., vol. 179, pp. 1689-1697 1978.
J. Am. Chem. Soc., vol. 54, pp. 1579-1587 1932.
J. Polym. Sci., vol. 29, pp. 343-353 1958.
MACROMOLECULES, vol. 25, pp. 12-17 1992.
MACROMOLECULES, vol. 20, pp. 705-712 1987.
MACROMOLECULES, vol. 21, pp. 1925-1929 1988.
Macromol. Chem., Rapid Commun., vol. 11, pp. 83-88 1990.

* cited by examiner

RADIATION-SENSITIVE COMPOSITION CHANGING IN REFRACTIVE INDEX AND METHOD OF CHANGING REFRACTIVE INDEX

FIELD OF THE INVENTION

The present invention relates to a radiation sensitive refractive index changing composition, a refractive index pattern forming method, a refractive index pattern and an optical material. More specifically, it relates to a novel radiation sensitive refractive index changing composition which is used in the optoelectronic and display fields, a refractive index pattern forming method, a refractive index pattern and an optical material.

PRIOR ART

In the current society called "multi-media society", refractive index distribution type optically molded products each consisting of different refractive index regions are in great demand. The products include not only optical fibers for transmitting information but also optical diffraction gratings having a periodical change in refractive index, optical memories to which information is written at sites having different refractive indices, optically coupled elements such as optical IC's having a fine refractive index pattern, optical control elements, optical modulation elements and optical transmission elements.

The refractive index distribution type optically molded products are divided into two types: one having a continuous refractive index distribution in the molded products, such as GI type optical fibers (to be referred to as "GRIN optically molded products" hereinafter) and the other having a discontinuous refractive index distribution, such as optical diffraction gratings and SI type optical waveguides.

The GRIN optically molded products are attracting much attention as the next-generation optically molded products. For example, a GI type optical fiber whose refractive index is reduced from the center axis of the core of the optical fiber to the periphery in a parabolic form enables the transmission of a great volume of information, and a GRIN lens whose refractive index continuously changes therein is used as a reading lens for use in copiers, spherical lens for connecting fibers, or micro-lens, making use of its characteristic features that it has refractive power even with a flat surface and that it is free from spherical aberration.

A large number of methods of producing the above GRIN optically molded products have been proposed up till now. For example, JP-A 9-133813, JP-A 8-336911, JP-A 8-337609, JP-A 3-192310, JP-A 5-60931 (the term "JP-A" as used herein means an "unexamined published Japanese patent application"), WO93/19505 and WO94/04949 disclose a method of obtaining a GI type optical fiber by dispersing low molecular weight compounds or a monomer into a polymer and continuously distributing its concentration. JP-A 62-25705 discloses that a GI type rod-like optically molded product or optical fiber is obtained by photocopolymerizing two or more vinyl monomers having different refractive indices and reactivity ratio. Further, JP-A 7-56026 discloses a method of obtaining a refractive index distribution by forming a polymer A having an optically reactive functional group, dispersing a compound B having a lower refractive index than the polymer A into the polymer A to form the concentration distribution of the compound B and optically reacting the polymer A with the compound B.

Some methods of producing GRIN optically molded products of an inorganic material have also been proposed. One of them is, for example, a method of producing a GI type rod by adding high-refractive index thallium to rod-like glass essentially composed of silicon or lead, immersing the glass in a molten solution containing low-refractive index potassium, and forming the concentration distribution of potassium by ion exchange.

A GRIN lens can be obtained likewise by applying the above method to a short rod, that is, lens-like optically molded product. Alternatively, the GI type rod produced by the above method may be sliced.

As one of methods of producing an optically molded product having a fine refractive index pattern, such as the above optical diffraction grating or optical IC, there is known a technology for obtaining a change in refractive index by causing a photochemical reaction in a molded product by irradiation. For instance, in the case of an inorganic material, glass doped with germanium is irradiated to change its refractive index so as to produce an optical diffraction grating. In the case of an organic material, the above technology is known as a photochromic reaction or photobleaching and JP-A 7-92313 discloses a technology for obtaining an optical diffraction grating by causing a change in refractive index by exposing a material obtained by dispersing low molecular weight compounds having photochemical reactivity in a polymer to a laser beam. Further, JP-A 9-178901 has recently proposed that this technology is applied to the production of a GRIN optically molded product. This method provides a continuous refractive index distribution in a depth direction with respect to irradiation, making use of the fact that light applied to a molded product is absorbed and weakened in intensity.

However, in the refractive index distributions obtained with the above conventional materials, the maximum refractive index difference is about 0.001 to 0.02 at best and it is difficult to provide a wider refractive index distribution in order to prevent an optical loss and suppress the malfunction of a circuit.

When a refractive index difference is created by irradiation, if the above conventional materials are used under the condition that light having a wavelength close to the wavelength used to change the refractive index passes therethrough after a refractive index distribution is formed, it will be impossible to prevent such a phenomenon that a gradual change in refractive index occurs, thereby deteriorating the materials.

SUMMARY OF THE INVENTION

The present invention has been made in view of the above problems of the prior art.

That is, it is an object of the present invention to provide a radiation sensitive refractive index changing composition whose refractive index is changed by a simple method, whose changed refractive index difference is sufficiently large, and which can provide a stable refractive index pattern and a stable optical material regardless of use conditions.

It is another object of the present invention to provide a radiation sensitive refractive index changing composition which provides a refractive index pattern having high film strength by exposure to radiation.

It is still another object of the present invention to provide a method of forming a refractive index pattern from the above composition of the present invention.

It is a further object of the present invention to provide a refractive index pattern or an optical material produced by the above method of the present invention.

Other objects and advantages of the present invention will become apparent from the following description.

Means for Solving the Problem

According to the present invention, firstly, the above objects and advantages of the present invention are attained by a radiation sensitive refractive index changing composition comprising (A) a decomposable compound, (B) a nondecomposable compound having a higher refractive index than the decomposable compound (A), (C) a radiation sensitive decomposer and (D) a stabilizer.

Secondly, the above objects and advantages of the present invention are attained by a refractive index pattern forming method comprising exposing a radiation sensitive refractive index changing composition comprising (A) a decomposable compound, (B) a non-decomposable compound having a higher refractive index than the decomposable compound (A), (C) a radiation sensitive decomposer and (D) a stabilizer to radiation and heating to react the stabilizer (D) with the decomposable compound (A) of an unexposed portion.

Thirdly, the above objects and advantages of the present invention are attained by a refractive index changing composition comprising (A) a decomposable compound, (B) a non-decomposable compound having a higher refractive index than the decomposable compound (A) and (C) a radiation sensitive decomposer.

In the fourth place, the above objects and advantages of the present invention are attained by a refractive index pattern forming method comprising exposing a refractive index changing composition comprising (A) a decomposable compound, (B) a non-decomposable compound having a higher refractive index than the decomposable compound (A) and (C) a radiation sensitive decomposer to radiation through a pattern mask and treating the composition with (D) a stabilizer to react the decomposable compound (A) of an unexposed portion with the stabilizer (D).

In the fifth place, the above objects and advantages of the present invention are attained by a refractive index pattern forming method comprising exposing a refractive index changing composition comprising (A) a decomposable compound, (B) a non-decomposable compound having a higher refractive index than the decomposable compound (A) and (C) a radiation sensitive decomposer to radiation through a pattern mask and heating to decompose the decomposable polymer of an unexposed portion.

In the sixth place, the above objects and advantages of the present invention are attained by a refractive index pattern formed by any one of the above refractive index pattern forming methods.

In the seventh place, the above objects and advantages of the present invention are attained by an optical material formed by any one of the above refractive index pattern forming methods.

BRIEF DESCRIPTION OF THE ACCOMPANYING DRAWINGS

Figure 2:
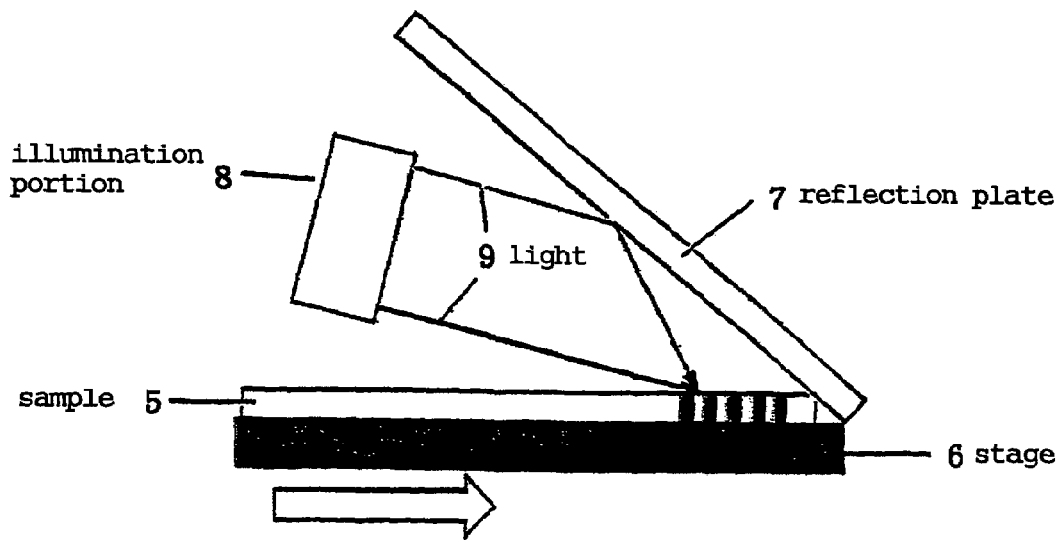

FIG. 1 is a schematic diagram of an apparatus for illuminating to form a lens from the refractive index changing composition of the present invention; and FIG. 2 is a schematic diagram of an apparatus for illuminating to form a diffraction grating from the refractive index changing composition of the present invention.

In the present invention, the term "refractive index pattern" means a refractive index distribution type material consisting of regions having different refractive indices.

A detailed description is subsequently given of each component of a refractive index changing material used in the refractive index pattern forming method of the present invention.

(A) Decomposable Compound

The decomposable compound (A) used in the present invention can be an acid decomposable compound or a base decomposable compound and its refractive index is preferably 1.5 or less, more preferably 1.45 or less. The weight average molecular weight of the decomposable compound (A) is preferably 100 to 500,000, more preferably 100 to 300,000.

The acid decomposable compound is selected from compounds having any one of structures represented by the following formulas (1) to (7). These compounds may be used alone or in combination of two or more.

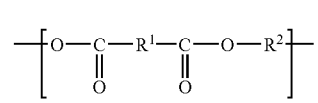

(In the formula (1), $R^1$ and $R^2$ are each independently is an alkylene group, perfluoroalkylene group or alkylsilylene group, and the above alkylene group or perfluoroalkylene group may contain —O—, —CO—, —COO— or —OCOO— bond.)

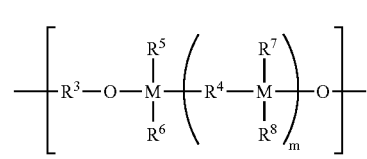

(In the formula (2), M is Si or Ge, $R^3$ is an alkylene group or perfluoroalkylene group, $R^4$ is an alkylene group, perfluoroalkylene group, alkylsilylene group or single bond, $R^5$, $R^6$, $R^7$ and $R^8$ are each independently a hydrogen atom, alkyl group, alkoxyl group, alkoxyester group, perfluoroalkyl group, perfluoroalkoxyl group, perfluoroalkoxyester group or perfluoroaryl group, and m is an integer of 0 to 2, the above alkylene group or perfluoroalkylene group may contain —O—, —CO—, —COO— or —OCOO— bond.)

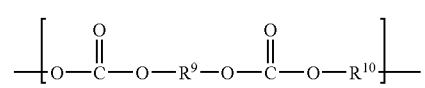

(In the formula (3), $R^9$ and $R^{10}$ are each independently an alkylene group or perfluoroalkylene group, and the above alkylene group or perfluoroalkylene group may contain —O—, —CO—, —COO— or —OCOO— bond.)

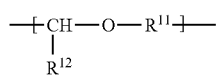
(4)

(In the formula (4), $R^{11}$ is an oxyalkylene group or single bond, and $R^{12}$ is a hydrogen atom, alkyl group, alkoxyl group, alkoxyester group, perfluoroalkyl group, perfluoroalkoxyester group or perfluoroaryl group.)

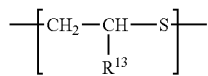
(5)

(In the formula (5), $R^{13}$ is a hydrogen atom, alkyl group, alkoxyl group, alkoxyester group, perfluoroalkyl group, perfluoroalkoxyl group, perfluoroalkoxyester group or perfluoroaryl group.)

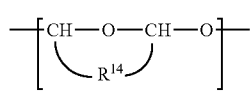
(6)

(In the formula (6), $R^{14}$ is an alkylene group or a structure represented by the following formula (6)-1, (6)-2 or (6)-3.)

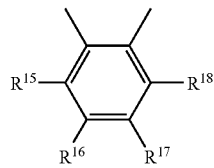
(6)-1

(In the formula (6)-1, $R^{15}, R^{16}, R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.)

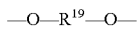
(6)-2

(In the formula (6)-2, $R^{19}$ is an alkylene group.)

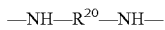
(6)-3

(In the formula (6)-3, $R^{20}$ is an alkylene group.)

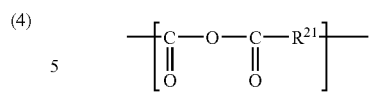
(7)

(In the formula (7), $R^{21}$ is an alkylene group.)

All the above alkylene groups may be each a linear, branched or cyclic alkylene group having 1 to 10 carbon atoms, and some of the hydrogen atoms contained in the above groups may be substituted by a fluorine atom, or some or all of the hydrogen atoms contained in the above groups may be substituted by a chlorine atom, bromine atom, perfluoroalkyl group, hydroxyl group, mercapto group, thioalkyl group, alkoxyl group, perfluoroalkoxyl group, alkylester group, alkylthioester group, perfluoroalkylester group, cyano group or nitro group.

The alkyl groups contained in all the above alkyl groups, alkoxyl groups and alkylester groups may be each a linear, branched or cyclic alkyl group having 1 to 10 carbon atoms, and some of the hydrogen atoms contained in the above groups may be substituted by a fluorine atom, or some or all of the hydrogen atoms contained in the above groups may be substituted by a chlorine atom, bromine atom, perfluoroalkyl group, hydroxyl group, mercapto group, thioalkyl group, alkoxyl group, perfluoroalkoxyl group, alkylester group, alkylthioester group, perfluoroalkylester group, cyano group or nitro group.

All the above perfluoroaryl groups include a perfluorophenyl group, perfluoronaphthyl group, perfluoroanthracenyl group, perphenylbiphenyl group, and the fluorine atom contained in the above groups may be substituted by a hydroxyl group, perfluoroalkoxyl group, perfluoroalkyl group, perfluoroalkylester group, cyano group or nitro group.

The above alkylsilylene groups have a structure represented by the following formula (8):

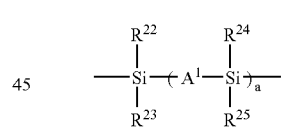
(8)

wherein $R^{22}$, $R^{23}$, $R^{24}$ and $R^{25}$ are each independently a hydrogen atom, chain alkyl group having 1 to 6 carbon atoms or aryl group having 6 to 10 carbon atoms, $A^1$ is —O—, alkylene group or arylene group, and a is an integer of 0 or 1.

The chain alkyl group having 1 to 6 carbon atoms in the above formula (6)-1 may be linear or branched, as exemplified by methyl, ethyl, n-propyl, i-propyl, n-butyl, i-butyl, sec-butyl, t-butyl, n-pentyl, neopentyl, n-hexyl and thexyl.

The alkoxyl group having 1 to 6 carbon atoms maybe linear or branched, as exemplified by methoxy, ethoxy, n-propoxy, i-propoxy, n-butoxy, i-butoxy, sec-butoxy, t-butoxy, n-pentyloxy, neopentyloxy, n-hexyloxy and thexyloxy.

The alkylthio group having 1 to 6 carbon atoms may be linear or branched, as exemplified by methylthio, ethylthio, n-propylthio, i-propylthio, n-butylthio, i-butylthio, sec-butylthio, t-butylthio, n-pentylthio, neopentylthio, n-hexylthio and thexylthio.

Examples of the haloalkyl group having 1 to 6 carbon atoms include trifluoromethyl, pentafluoroethyl, heptafluoropropyl, chloromethyl, 2-chloroethyl, 3-chloropropyl, 1-chloromethylethyl, 4-chlorobutyl, 2-chloromethylpropyl, 5-chloropentyl, 3-chloromethylbutyl, 2-chloroethylpropyl, 6-chlorohexyl, 3-chloromethylpentyl, 4-chloromethylpentyl, 2-chloroethylbutyl, bromomethyl, 2-bromoethyl, 3-bromopropyl, 1-bromomethylethyl, 4-bromobutyl, 2-bromomethylpropyl, 5-bromopentyl, 3-bromomethylbutyl, 2-bromoethylpropyl, 6-bromohexyl, 3-bromomethylpentyl, 4-bromomethylpentyl and 2-bromoethylbutyl.

Examples of the haloalkoxyl group having 1 to 6 carbon atoms include trifluoromethoxy, pentafluoroethoxy, heptafluoropropoxy, chloromethoxy, 2-chloroethoxy, 3-chloropropoxy, 1-chloromethylethoxy, 4-chlorobutoxy, 2-chloromethylpropoxy, 5-chloropentyloxy, 3-chloromethylbutoxy, 2-chloroethylpropoxy, 6-chlorohexyloxy, 3-chloromethylpentyloxy, 4-chloromethylpentyloxy, 2-chloroethylbutoxy, bromomethoxy, 2-bromoethoxy, 3-bromopropoxy, 1-bromomethylethoxy, 4-bromobutoxy, 2-bromomethylpropoxy, 5-bromopentyloxy, 3-bromomethylbutoxy, 2-bromoethylpropoxy, 6-bromohexyloxy, 3-bromomethylpentyloxy, 4-bromomethylpentyloxy and 2-bromoethylbutoxy.

Examples of the haloalkylthio group having 1 to 6 carbon atoms include trifluoromethylthio, pentafluoroethylthio, heptafluoropropylthio, chloromethylthio, 2-chloroethylthio, 3-chloropropylthio, 1-chloromethylethylthio, 4-chlorobutylthio, 2-chloromethylpropylthio, 5-chloropentylthio, 3-chloromethylbutylthio, 2-chloroethylpropylthio, 6-chlorohexylthio, 3-chloromethylpentylthio, 4-chloromethylpentylthio, 2-chloroethylbutylthio, bromomethylthio, 2-bromoethylthio, 3-bromopropylthio, 1-bromomethylethylthio, 4-bromobutylthio, 2-bromomethylpropylthio, 5-bromopentylthio, 3-bromomethylbutylthio, 2-bromoethylpropylthio, 6-bromohexylthio, 3-bromomethylpentylthio, 4-bromomethylpentylthio and 2-bromoethylbutylthio.

Examples of the hydroxyalkyl group having 1 to 6 carbon atoms include hydroxymethyl, 2-hydroxyethyl, 3-hydroxypropyl, 1-hydroxymethylethyl, 4-hydroxybutyl, 2-hydroxymethylpropyl, 5-hydroxypentyl, 3-hydroxymethylbutyl, 2-hydroxyethylpropyl, 6-hydroxyhexyl, 3-hydroxymethylpentyl, 4-hydroxymethylpentyl and 2-hydroxyethylbutyl.

Examples of the mercaptoalkyl group having 1 to 6 carbon atoms include mercaptomethyl, 2-mercaptoethyl, 3-mercaptopropyl, 1-mercaptomethylethyl, 4-mercaptobutyl, 2-mercaptomethylpropyl, 5-mercaptopentyl, 3-mercaptomethylbutyl, 2-mercaptoethylpropyl, 6-mercaptohexyl, 3-mercaptomethylpentyl, 4-mercaptomethylpentyl and 2-mercaptoethylbutyl.

Examples of the hydroxyalkoxyl group having 1 to 6 carbon atoms include hydroxymethoxy, 2-hydroxyethoxy, 3-hydroxypropoxy, 1-hydroxymethylethoxy, 4-hydroxybutoxy, 2-hydroxymethylpropoxy, 5-hydroxypentyloxy, 3-hydroxymethylbutoxy, 2-hydroxyethylpropoxy, 6-hydroxyhexyloxy, 3-hydroxymethylpentyloxy, 4-hydroxymethylpentyloxy and 2-hydroxyethylbutoxy.

Examples of the mercaptoalkylthio group having 1 to 6 carbon atoms include mercaptomethylthio, 2-mercaptoethylthio, 3-mercaptopropylthio, 1-mercaptomethylethylthio, 4-mercaptobutylthio, 2-mercapomethylpropylthio, 5-mercaptopentylthio, 3-mercaptomethylbutylthio, 2-mercaptoethylpropylthio, 6-mercaptohexylthio, 3-mercaptomethylpentylthio, 4-mercaptomethylpentylthio and 2-mercaptoethylbutylthio.

Examples of the aryl group having 6 to 10 carbon atoms include phenyl, tolyl, xylyl, cumenyl and 1-naphthyl.

Examples of the aralkyl group having 7 to 11 carbon atoms include benzyl, α-methylbenzyl, phenethyl and naphthylmethyl.

Methods of producing acid decomposable compounds or base decomposable compounds having structures represented by the above formulas (1) to (7) in the present invention as a recurring unit, for example, are already known.

Methods of producing a compound having a structure represented by the above formula (1) are disclosed by Polymer Bull., 1.199 (1978), JP-A62-136638, EP 225,454, U.S. Pat. No. 806,597, JP-A 4-303843, JP-A 7-56354 and the like.

Methods of producing a compound having a structure represented by the above formula (2) are disclosed by Macromolecules 29, 5529 (1996), Polymer 17, 1086 (1976), JP-A 60-37549 and the like.

Methods of producing a compound having a structure represented by the above formula (3) are disclosed by Electrochem. Soc., Solid State Sci. Technol., 133(1) 181 (1986), J. Imaging Sci., 30(2)59 (1986), Macromol. Chem., Rapid Commun., 7, 121(1986) and the like.

Methods of producing a compound having a structure represented by the above formula (4) are disclosed by U.S. Pat. No. 3,894,253, JP-A 62-190211, JP-A 2-146544, Macromol. Chem., 23, 16 (1957), JP-A63-97945, Polymer Sci., A-1, 8, 2375(1970), U.S. Pat. No. 4,247,611, EP 41,657, JP-A 57-31674, JP-A 64-3647, JP-A 56-17345 and the like.

Methods of producing a compound having a structure represented by the above formula (5) are disclosed by Prepr. Eur. Disc Meet. Polymer Sci., Strasbourg, p.106 (1978), Macromol. Chem., 179, 1689 (1978) and the like.

Methods of producing a compound having a structure represented by the above formula (6) are disclosed by U.S. Pat. No. 3,894,253, U.S. Pat. No. 3,940,507, JP-A 62-190211 and the like.

Methods of producing a compound having a structure represented by the above formula (7) are disclosed by J. Am. Chem. Soc., 54, 1579 (1932), J. Polym. Sci., 29, 343 (1958), J. Polym. Sci., Part A, Polym. Chem., 25, 3373 (1958), Macromolecules, 25, 12, (1992), Macromolecules, 20, 705, (1987), Macromolecules, 21, 1925, (1988), Macromol. Chem., Rapid Commun., 11, 83 (1990) and the like.

The non-decomposable compound (B) used in the present invention is stable to an acid or base and preferably has high optical transparency. The refractive index of the component (B) can be suitably set and adjusted to a preferred value according to application purpose. The refractive index $n_B$ of the compound (B) is higher than the refractive index $n_A$ of the compound (A) and preferably satisfies the following expression (1).

$$n_B - n_A \geq 0.05 \qquad (1)$$

The non-decomposable compound (B) may be a non-decomposable polymer.

Examples of the non-decomposable polymer (B) include an acrylic-based resin, urethane-based resin, polyester-based resin, polycarbonate-based resin, norbornene-based resin, styrene-based resin, polyether sulfone-based resin, silicon resin, polyamide resin, polyimide resin, polysiloxane-based resin, fluorinated resin, polybutadiene-based resin, vinylether-based resin and vinylester-based resin. A preferred non-decomposable polymer (B) can be suitably selected according to the refractive index of the decomposable polymer (A) used. To increase the difference between the refractive index of the decomposable polymer (A) and the refractive index of the non-decomposable polymer (B), a non-decomposable polymer (B) having an aromatic group, halogen atom or sulfur atom may be advantageously used.

More specific examples of the non-decomposable polymer (B) include the following polymers (the figures within parentheses are refractive index values measured by d-ray): polyvinylidene fluoride (1.42), polydimethylsiloxane (1.43), polytrifluoroethyl methacrylate (1.44), polyoxypropylene (1.45), polyvinylisobutyl ether (1.45), polyvinylethyl ether (1.45), polyoxyethylene (1.46), polyvinylbutyl ether (1.46), polyvinylpentyl ether (1.46), polyvinylhexyl ether (1.46), poly(4-methyl-1-pentene) (1.46 to 1.47), cellulose acetate butyrate (1.46 to 1.49), poly(4-fluoro-2-trifluoromethylstyrene) (1.46), polyvinyloctyl ether (1.46), poly(vinyl 2-ethylhexyl ether) (1.46), polyvinyldecyl ether (1.46), poly(2-methoxyethyl acrylate) (1.46), polybutyl acrylate (1.47), poly(t-butyl methacrylate) (1.46), polyvinyldodecyl ether (1.46), poly(3-ethoxypropyl acrylate) (1.47), polyoxycarbonyl tetramethylene (1.47), polyvinyl propionate (1.47), polyvinyl acetate (1.47), polyvinylmethyl ether (1.47), polyethyl acrylate (1.47), ethylene-vinyl acetate copolymer (1.47 to 1.50), (80% to 20% of vinylacetate)cellulose propionate (1.47 to 1.49), cellulose acetate propionate (1.47), benzyl cellulose (1.47 to 1.58), phenol-formaldehyde resin (1.47 to 1.70), cellulose triacetate (1.47 to 1.48), polyvinylmethyl ether (isotactic) (1.47), poly(3-methoxypropyl acrylate) (1.47), poly(2-ethoxyethyl acrylate) (1.47), polymethyl acrylate (1.47 to 1.48), polyisopropyl methacrylate (1.47), poly(1-decene) (1.47), polypropylene (atactic, density of 0.8575 g/cm³) (1.47), poly(vinyl sec-butyl ether) (isotactic) (1.47), polydodecyl methacrylate (1.47), polyoxyethylene oxysuccinoyl (1.47), (polyethylene succinate) polytetradecyl methacrylate (1.47), ethylene-propylene copolymer (EPR-rubber) (1.47 to 1.48), polyhexadecyl methacrylate (1.48), polyvinyl formate (1.48), poly(2-fluoroethyl methacrylate) (1.48), polyisobutyl methacrylate (1.48), ethyl cellulose (1.48), polyvinyl acetal (1.48 to 1.50), cellulose acetate (1.48 to 1.50), cellulose tripropionate (1.48 to 1.49), polyoxymethylene (1.48), polyvinyl butyral (1.48 to 1.49), poly(n-hexylmethacrylate) (1.48), poly(n-butyl methacrylate) (1.48), polyethylidene dimethacrylate (1.48), poly(2-ethoxyethyl methacrylate) (1.48), polyoxyethylene oxymaleoyl (1.48), (polyethylene maleate) poly(n-propyl methacrylate) (1.48), poly(3,3,5-trimethylcyclohexyl methacrylate) (1.49), polyethyl methacrylate (1.49), poly(2-nitro-2-methylpropyl methacrylate) (1.49), polytriethylcarbinyl methacrylate (1.49), poly(1,1-diethylpropyl methacrylate) (1.49), polymethylmethacrylate (1.49), poly(2-decyl-1,3-butadiene) (1.49), polyvinyl alcohol (1.49 to 1.53), polyethyl glycolate methacrylate (1.49), poly(3-methylcyclohexyl methacrylate) (1.49), poly(cyclohexyl α-ethoxyacrylate) (1.50), methyl cellulose (low viscosity) (1.50), poly(4-methylcyclohexyl methacrylate) (1.50), polydecamethylene glycol dimethacrylate (1.50), polyurethane (1.50 to 1.60), poly(1,2-butadiene) (1.50), polyvinyl formal (1.50), poly(2-bromo-4-trifluoromethylstyrene) (1.50), cellulose nitrate (1.50 to 1.51), poly(sec-butyl α-chloroacrylate) (1.50), poly(2-heptyl-1,3-butadiene) (1.50), poly(ethyl α-chloroacrylate) (1.50), poly(2-isopropyl-1,3-butadiene) (1.50), poly(2-methylcyclohexyl methacrylate) (1.50), polypropylene (density of 0.9075 g/cm³) (1.50),polyisobutene (1.51), polybornyl methacrylate (1.51), poly(2-t-butyl-1,3-butadiene) (1.51), polyethylene glycol dimethacrylate (1.51), polycyclohexyl methacrylate (1.51), poly(cyclohexanediol-1,4-dimethacrylate) (1.51), butyl rubber (unvulcanized) (1.51), polytetrahydrofurfuryl methacrylate (1.51), guttapercha (β) (1.51), polyethylene ionomer (1.51), polyoxyethylene (high molecular weight) (1.51 to 1.54), polyethylene (density of 0.914 g/cm³) (1.51), (density of 0.94 to 0.945 g/cm³) (1.52 to 1.53), (density of 0.965 g/cm³) (1.55), poly(1-methylcyclohexyl methacrylate) (1.51), poly(2-hydroxyethyl methacrylate) (1.51), polyvinyl chloroacetate (1.51), polybutene (isotactic) (1.51), polyvinyl methacrylate (1.51), poly(N-butyl-methacrylamide) (1.51), guttapercha (α) (1.51), terpene resin (1.52), poly(1,3-butadiene) (1.52), shellac (1.51 to 1.53), poly(methyl α-chloroacrylate) (1.52), poly(2-chloroethyl methacrylate) (1.52), poly(2-diethylaminoethyl methacrylate) (1.52), poly(2-chlorocyclohexyl methacrylate) (1.52), poly(1,3-butadiene) (35% of cis-form; 56% of trans-form 1.5180; 7% of 1,2-bond-form), natural rubber (1.52), polyallyl methacrylate (1.52), polyvinyl chloride+40% of dioctyl phthalate (1.52), polyacrylonitrile (1.52), polymethacrylonitrile (1.52), poly (1,3-butadiene) (rich with cis type) (1.52), butadiene-acrylonitrile copolymer (1.52), polymethyl isopropenyl ketone (1.52), polyisoprene (1.52), polyester resin rigid (about 50% of styrene) (1.52 to 1.54), poly(N-(2-methoxyethyl)methacrylamide) (1.52), poly(2,3-dimethylbutadiene) (methyl rubber) (1.53), vinyl chloride-vinyl acetate copolymer (95/5 to 90/10) (1.53 to 1.54), polyacrylic acid (1.53), poly(1,3-dichloropropyl methacrylate) (1.53), poly(2-chloro-1-(chloromethyl)ethyl methacrylate) (1.53), polyacrolein (1.53), poly(1-vinyl-2-pyrrolidone) (1.53), rubber hydrochloride (1.53 to 1.55), nylon 6; nylon 6,6; nylon 6,10 (molded product) (1.53), butadiene-styrene copolymer (about 30% of styrene) (1.53), poly(cyclohexyl-α-chloroacrylate) block copolymer (1.53), poly(2-chloroethyl-α-chloroacrylate) (1.53), butadiene-styrene copolymer (about 75/25) (1.54), poly(2-aminoethyl methacrylate) (1.54), polyfurfuryl methacrylate (1.54), polybutylmercaptyl methacrylate (1.54), poly(1-phenyl-n-amyl methacrylate) (1.54), poly(N-methyl-methacrylamide) (1.54), cellulose (1.54), polyvinyl chloride (1.54 to 1.55), urea formaldehyde resin (1.54 to 1.56), poly(sec-butyl α-bromoacrylate) (1.54), poly(cyclohexyl α-bromoacrylate) (1.54), poly(2-bromoethyl methacrylate) (.1.54), polydihydroabietic acid (1.54), polyabietic acid (1.546), polyethylmercaptyl methacrylate (1.55), poly(N-allylmethacrylamide) (1.55), poly(1-phenylethyl methacrylate) (1.55), polyvinylfuran (1.55), poly(2-vinyltetrahydrofuran) (1.55), poly(vinylchloride)+40% of tricresyl phosphate (1.55), poly(p-methoxybenzyl methacrylate) (1.55), polyisopropyl methacrylate (1.55), poly(p-isopropylstyrene) (1.55), polychloroprene (1.55 to 1.56), poly(oxyethylene-α-benzoate-ω-methacrylate) (1.56), poly(p,p'-xylylenyl dimethacrylate) (1.56), poly(1-phenylallyl methacrylate) (1.56), poly(p-cyclohexylphenyl methacrylate) (1.56), poly(2-phenylethyl methacrylate) (1.56), poly (oxycarbonyloxy-1,4-phenylene-1-propyl) (1.56), poly(1-(o-chlorophenyl)ethyl methacrylate) (1.56), styrene-maleic anhydride copolymer (1.56), poly(1-phenylcyclohexyl methacrylate) (1.56), poly(oxycarbonyloxy-1,4-phenylene-1,3-dimethyl-butylidene-1,4-phenylene) (1.57), poly(methyl α-bromoacrylate) (1.57), polybenzyl methacrylate (1.57), poly(2-(phenylsulfonyl)ethyl methacrylate) (1.57), poly(m-cresyl methacrylate) (1.57), styrene-acrylonitrile copolymer (about 75/25) (1.57), poly(oxycarbonyloxy-1,4-phenylene isobutylidene-1,4-phenylene) (1.57), poly(o-methoxyphenyl methacrylate) (1.57), polyphenyl methacrylate (1.57), poly(o-cresyl methacrylate) (1.57), polydiallyl phthalate (1.57), poly(2,3-dibromopropyl methacrylate) (1.57), poly(oxycarbonyloxy-1,4-phenylene-1-methyl-butylidene-1, 4-phenylene) (1.57), poly(oxy-2,6-dimethylphenylene) (1.58), polyoxyethylene oxyterephthaloyl (amorphous) (1.58), polyethylene terephthalate (1.51 to 1.64), polyvinyl benzoate (1.58), poly(oxycarbonyloxy-1,4-phenylenebutylidene-1,4-phenylene) (1.58), poly(1,2-diphenylethyl methacrylate) (1.58), poly(o-chlorobenzyl methacrylate) (1.58), poly(oxycarbonyloxy-1,4-phenylene-sec-butylidene-1,4-phenylene) (1.58), polyoxypentaerythritoloxyphthaloyl (1.58), poly(m-nitrobenzyl methacrylate) (1.58), poly(oxycarbonyloxy-1,4-phenyleneisopropylidene-1,4-phenylene) (1.59), poly(N-(2-phenylethyl)methacrylamide) (1.59), poly(4-methoxy-2-methylstyrene) (1.59), poly(o-methylstyrene) (1.59), polystyrene (1.59), poly(oxycarbonyloxy-1,4-phenylenecyclohexylidene-1,4-phenylene) (1.59), poly(o-methoxystyrene) (1.59), polydiphenylmethyl methacrylate (1.59), poly(oxycarbonyloxy-1,4-phenyleneethylidene-1,4-phenylene) (1.59), poly(p-bromophenyl methacrylate) (1.60), poly(N-benzylmethacrylamide) (1.60), poly(p-methoxystyrene) (1.60), polyvinylidene chloride (1.60 to 1.63), polysulfide ("Thiokol") (1.6 to 1.7), poly(o-chlorodiphenylmethyl methacrylate) (1.60), poly(oxycarbonyloxy-1,4-(2,6-dichloro)phenylene-isopropylidene-1,4-(2,6-dichloro)phenylene) (1.61), poly(oxycarbonyloxybis(1,4-(3,5-dichlorophenylene)))poly pentachlorophenyl methacrylate (1.61), poly(o-chlorostyrene) (1.61), poly(phenyl α-bromoacrylate) (1.61), poly(p-divinylbenzene) (1.62), poly(N-vinylphthalimide) (1.62), poly(2,6-dichlorostyrene) (1.62), poly(β-naphthyl methacrylate) (1.63), poly(α-naphthylcarbinyl methacrylate) (1.63), polysulfone (1.63), poly(2-vinylthiophene) (1.64), poly(α-naphthyl methacrylate) (1.64), poly(oxycarbonyloxy-1,4-phenylenediphenyl-methylene-1,4-phenylene) (1.65), polyvinylphenyl sulfide (1.66), butylphenol formaldehyde resin (1.66), urea-thiourea-formaldehyde resin (1.66), polyvinyl naphthalene (1.68), polyvinyl carbazole (1.68), naphthalene-formaldehyde resin (1.70), phenol-formaldehyde resin (1.70), polypentabromophenyl methacrylate (1.71) and the like.

The non-decomposable polymer (B) may be a copolymer of two or more monomers constituting the above polymers.

Out of these, polymers having a d-ray refractive index of 1.45 or more are preferred and polymers having a d-ray refractive index of 1.5 or more are more preferred.

The weight average molecular weight of the non-decomposable polymer (B) is preferably 100 to 500,000, more preferably 100 to 200,000.

A compound represented by the following formula (9), a hydrolysate or condensate thereof is also used as the non-decomposable compound (B):

$$R^{213}{}_n Si(OR^{214})_{4-n} \quad (9)$$

wherein $R^{213}$ and $R^{214}$ may be the same or different and each a monovalent organic group, and n is an integer of 0 to 2.

Examples of the monovalent organic group in the above formula (9) include alkyl group, aryl group, allyl group and glycidyl group. Examples of the alkyl group include methyl, ethyl, propyl and butyl, out of which an alkyl group having 1 to 5 carbon atoms is preferred. The alkyl group may be linear or branched and may contain a halogen atom such as fluorine atom substituted for a hydrogen atom. Examples of the aryl group in the above formula (9) include phenyl and naphthyl. n is preferably 1 or 2 in the above formula (9).

Illustrative examples of the alkylalkoxysilane represented by the above formula (9) include methyl trimethoxysilane, methyl triethoxysilane, methyl tri-n-propoxysilane, methyl triisopropoxysilane, methyl tri-n-butoxysilane, methyl tri-sec-butoxysilane, methyl tri-tert-butoxysilane, methyl triphenoxysilane, ethyl trimethoxysilane, ethyl triethoxysilane, ethyl tri-n-propoxysilane, ethyl triisopropoxysilane, ethyl tri-n-butoxysilane, ethyl tri-sec-butoxysilane, ethyl tri-tert-butoxysilane, ethyl triphenoxysilane, n-propyl trimethoxysilane, n-propyl triethoxysilane, n-propyl tri-n-propoxysilane, n-propyl triisopropoxysilane, n-propyl tri-n-butoxysilane, n-propyltri-sec-butoxysilane, n-propyl tri-tert-butoxysilane, n-propyltriphenoxysilane, isopropyl trimethoxysilane, isopropyl triethoxysilane, isopropyl tri-n-propoxysilane, isopropyl triisopropoxysilane, isopropyl tri-n-butoxysilane, isopropyl tri-sec-butoxysilane, isopropyl tri-tert-butoxysilane, isopropyl triphenoxysilane, n-butyl trimethoxysilane, n-butyl triethoxysilane, n-butyl tri-n-propoxysilane, n-butyl triisopropoxysilane, n-butyl tri-n-butoxysilane, n-butyl tri-sec-butoxysilane, n-butyl tri-tert-butoxysilane, n-butyl triphenoxysilane, sec-butyl trimethoxysilane, sec-butyl isotriethoxysilane, sec-butyl tri-n-propoxysilane, sec-butyl triisopropoxysilane, sec-butyltri-n-butoxysilane, sec-butyl tri-sec-butoxysilane, sec-butyl tri-tert-butoxysilane, sec-butyl triphenoxysilane, tert-butyl trimethoxysilane, tert-butyl triethoxysilane, tert-butyl tri-n-propoxysilane, tert-butyl triisopropoxysilane, tert-butyl tri-n-butoxysilane, tert-butyl tri-sec-butoxysilane, tert-butyl tri-tert-butoxysilane, tert-butyl triphenoxysilane, cyclohexyl trimethoxysilane, cyclohexyl triethoxysilane, cyclohexyl tri-n-propoxysilane, cyclohexyl triisopropoxysilane, cyclohexyl tri-n-butoxysilane, cyclohexyl tri-sec-butoxysilane, cyclohexyl tri-tert-butoxysilane, cyclohexyl triphenoxysilane, norbornyl trimethoxysilane, norbornyl triethoxysilane, norbornyl tri-n-propoxysilane, norbornyl triisopropoxysilane, norbornyl tri-n-butoxysilane, norbornyl tri-sec-butoxysilane, norbornyl tri-tert-butoxysilane, norbornyl triphenoxysilane, phenyl trimethoxysilane, phenyl triethoxysilane, phenyl tri-n-propoxysilane, phenyl triisopropoxysilane, phenyl tri-n-butoxysilane, phenyl tri-sec-butoxysilane, phenyl tri-tert-butoxysilane, phenyl triphenoxysilane, dimethyl dimethoxysilane, dimethyl diethoxysilane, dimethyl di-n-propoxysilane, dimethyl diisopropoxysilane, dimethyl di-n-butoxysilane, dimethyl di-sec-butoxysilane, dimethyl di-tert-butoxysilane, dimethyl diphenoxysilane, diethyl dimethoxysilane, diethyl diethoxysilane, diethyl di-n-propoxysilane, diethyl diisopropoxysilane, diethyl di-n-butoxysilane, diethyl di-sec-butoxysilane, diethyl di-tert-butoxysilane, diethyl diphenoxysilane, di-n-propyl dimethoxysilane, di-n-propyl diethoxysilane, di-n-propyl di-n-propoxysilane, di-n-propyl diisopropoxysilane, di-n-propyl di-n-butoxysilane, di-n-propyl di-sec-butoxysilane, di-n-propyl di-tert-butoxysilane, di-n-propyl diphenoxysilane, diisopropyl dimethoxysilane, diisopropyl diethoxysilane, diisopropyldi-n-propoxysilane, diisopropyl diisopropoxysilane, diisopropyl di-n-butoxysilane, diisopropyl di-sec-butoxysilane, diisopropyl di-tert-butoxysilane, diisopropyl diphenoxysilane, di-n-butyl dimethoxysilane, di-n-butyl diethoxysilane, di-n-butyl di-n-propoxysilane, di-n-butyl diisopropoxysilane, di-n-butyl di-n-butoxysilane, di-n-butyl di-sec-butoxysilane, di-n-butyl di-tert-butoxysilane, di-n-butyl diphenoxysilane, di-sec-butyl dimethoxysilane, di-sec-butyl diethoxysilane, di-sec-butyl di-n-propoxysilane, di-sec-butyl diisopropoxysilane, di-sec-butyl di-n-butoxysilane, di-sec-butyl di-sec-butoxysilane, di-sec-butyl di-tert-butoxysilane, di-sec-butyl diphenoxysilane, di-tert-butyl dimethoxysilane, di-tert-butyl diethoxysilane, di-tert-butyl di-n-propoxysilane, di-tert-butyl diisopropoxysilane, di-tert-butyl di-n-butoxysilane, di-tert-butyl di-sec-butoxysilane, di-tert-butyl di-tert-butoxysilane, di-tert-butyl diphenoxysilane, di-tert-butyldimethoxysilane, dicyclohexyldiethoxysilane, di-tert-butyl di-n-propoxysilane, dicyclohexyl diisopropoxysilane, dicyclohexyl di-n-butoxysilane, dicyclohexyl di-sec-butoxysilane, dicyclohexyl di-tertbutoxysilane, dicyclohexyl diphenoxysilane, di-tert-butyl dimethoxysilane, dinorbornyl diethoxysilane, di-tert-butyl di-n-propoxysilane, dinorbornyl diisopropoxysilane, dinorbornyl di-n-butoxysilane, dinorbornyl di-sec-butoxysilane, dinorbornyl di-tert-butoxysilane, dinorbornyl diphenoxysilane, diphenyl dimethoxysilane, diphenyl diethoxysilane, diphenyl di-n-propoxysilane, diphenyl diisopropoxysilane, diphenyl di-n-butoxysilane, diphenyl di-sec-butoxysilane, diphenyl di-tert-butoxysilane, diphenyl diphenoxysilane, divinyl trimethoxysilane, γ-aminopropyl trimethoxysilane, γ-aminopropyl triethoxysilane, γ-glycidyloxypropyl trimethoxysilane, γ-glycidyloxypropyl triethoxysilane, γ-trifluoropropyl trimethoxysilane and γ-trifluoropropyl triethoxysilane. Compounds obtained by substituting some of the hydrogen atoms of the above compounds with a fluorine atom may also be used. These compounds represented by the above formula (9) may be used alone or in combination of two or more.

Out of the compounds represented by the above formula (9), aryltrialkoxysilanes of the formula (9) in which n is 1 are particularly preferred. Out of these, phenyl trimethoxysilane and phenyl triethoxysilane are preferred. When phenyl trimethoxysilane and/or phenyl triethoxysilane are/is used in an amount of 70 mol % or more based on the total of all the arylalkoxysilanes, a cured product having good balance between heat resistance and refractive index is obtained. A hydrolysate and condensate of a compound represented by the above formula (9) are more preferred than the compound represented by the above formula (9). When the component (B) is a condensate of a compound represented by the above formula (9), it preferably has a weight average molecular weight of 500 to 100,000 in terms of polystyrene.

When a hydrolysate and/or condensate of a compound represented by the above formula (9) are/is used as the component (B), a hydrolytic reaction and/or a condensation reaction are/is carried out in the presence of water and a suitable catalyst as will be described hereinbelow.

Stated specifically, the compound represented by the above formula (9) is dissolved in a suitable organic solvent and water is intermittently or continuously added to this solution. The catalyst may be dissolved or dispersed in the organic solvent in advance, or dissolved or dispersed in water to be added.

The temperature for carrying out the hydrolytic reaction and/or condensation reaction is generally 0 to 100° C., preferably 15 to 80° C.

Water for carrying out the hydrolysis and/or condensation of the compound represented by the above formula (9) is not particularly limited but ion exchange water is preferably used.

The amount of water is preferably 0.25 to 3 mols, particularly preferably 0.3 to 2.5 mols based on 1 mol of the total of groups represented by $R^{214}O—$ of the compound represented by the above formula (9).

The catalyst for carrying out the hydrolysis and/or condensation of the compound represented by the above formula (9) is a metal chelate compound, organic acid, inorganic acid, organic base or inorganic base.

Illustrative examples of the metal chelate compound used as the catalyst include titanium chelate compounds such as triethoxy.mono(acetylacetonato)titanium, tri-n-propoxy.mono(acetylacetonato)titanium, tri-i-propoxy.mono(acetylacetonato)titanium, tri-n-butoxy.mono(acetylacetonato)titanium, tri-sec-butoxy.mono(acetylacetonato)titanium, tri-t-butoxy.mono(acetylacetonato)titanium, diethoxy.bis(acetylacetonato)titanium, di-n-propoxy.bis(acetylacetonato)titanium, di-i-propoxy.bis(acetylacetonato)titanium, di-n-butoxy.bis(acetylacetonato)titanium, di-sec-butoxy.bis(acetylacetonato)titanium, di-t-butoxy.bis(acetylacetonato)titanium, monoethoxy.tris(acetylacetonato)titanium, mono-n-propoxy.tris(acetylacetonato)titanium, mono-i-propoxy.tris(acetylacetonato)titanium, mono-n-butoxy.tris(acetylacetonato)titanium, mono-sec-butoxy.tris(acetylacetonato)titanium, mono-t-butoxy.tris(acetylacetonato)titanium, tetrakis(acetylacetonato)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium and tris(acetylacetonato)mono(ethylacetoacetate)titanium; zirconium chelate compounds such as triethoxy.mono(acetylacetonato) zirconium, tri-n-propoxy.mono(acetylacetonato)zirconium, tri-i-propoxy.mono(acetylacetonato)zirconium, tri-n-butoxy.mono(acetylacetonato)zirconium, tri-sec-butoxy.mono(acetylacetonato)zirconium, tri-t-butoxy.mono(acetylacetonato)zirconium, diethoxy.bis(acetylacetonato)zirconium, di-n-propoxy.bis(acetylacetonato)zirconium, di-i-propoxy.bis(acetylacetonato)zirconium, di-n-butoxy.bis(acetylacetonato)zirconium, di-sec-butoxy.bis(acetylacetonato)zirconium, di-t-butoxy.bis(acetylacetonato)zirconium, monoethoxy.tris(acetylacetonato)zirconium, mono-n-propoxy.tris(acetylacetonato)zirconium, mono-i-propoxy.tris(acetylacetonato)zirconium, mono-n-butoxy.tris(acetylacetonato)zirconium, mono-sec-butoxy.tris(acetylacetonato)zirconium, mono-t-butoxy.tris(acetylacetonato)zirconium, tetrakis(acetylacetonato)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethylacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)

zirconium and tris(acetylacetonato)mono(ethylacetoacetate) zirconium; and aluminum chelate compounds such as tris (acetylacetonato)aluminum and tris(ethylacetoacetate) aluminum.

Examples of the organic acid used as the catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, micimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phallic acid, fumaric acid, citric acid and tartaric acid.

Examples of the inorganic acid used as the catalyst include hydrochloric acid, nitric acid, sulfuric acid, hydrofluoric acid and phosphoric acid.

Examples of the organic base used as the catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide.

Examples of the inorganic base used as the catalyst include ammonia, sodium hydroxide, potassium hydroxide, barium hydroxide and calcium hydroxide.

Out of these, a metal chelate compound, an organic acid or an inorganic acid is preferably used as the catalyst and a titanium chelate compound or an organic acid is more preferably used.

These compounds may be used alone or in combination of two or more as the catalyst.

The amount of the catalyst is generally 0.001 to 10 parts by weight, preferably 0.01 to 10 parts by weight based on 100 parts by weight of the compound represented by the above formula (9) in terms of $SiO_2$.

Further, it is preferred to remove the residual water and an alcohol formed as a reaction by-product after the hydrolysis and/or condensation of the compound represented by the above formula (9).

As the non-decomposable component (B) is advantageously used a ladder type polysilsequioxane represented by the following formula (10):

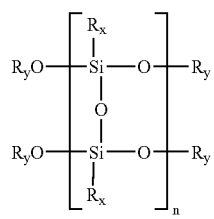

(10)

wherein $R_x$ is a monovalent organic group, $R_y$ is a hydrogen atom or monovalent organic group, $R_x$ and $R_y$ may be the same or different, and n is a positive integer corresponding to the molecular weight.

The monovalent organic group in the above formula (10) is, for example, an alkyl group, aryl group, allyl group, glycidyl group or the like. Examples of the alkyl group include methyl, ethyl and propyl and preferably have 1 to 5 carbon atoms. These alkyl groups may be linear or branched. Examples of the aryl group include phenyl, naphthyl and tolyl. The hydrogen atoms of the alkyl group, aryl group, allyl group and glycidyl group may be substituted by a halogen atom such as chlorine atom or bromine atom, hydroxyl group, mercapto group, alkoxyl group, thioalkyl group, alkylester group, alkylthioester group or aryl group.

Methods of producing a compound having a structure represented by the above formula (10) are disclosed by JP-A 56-157885, JP-A57-40526 and JP-A58-69217. The commercially available products of these compounds include GR-100, GR-650, GR-908 and GR-950 (of Showa Denko K.K.).

Not only the compound represented by the above formula (10) but also a hydrolysate and condensate thereof may be used as the component (B). The hydrolytic reaction and condensation reaction of the compound may be carried out under conditions (catalyst, water, reaction temperature) similar to the hydrolytic reaction/condensation reaction conditions of the compound represented by the above formula (9). The compound represented by the above formula (10) has a weight average molecular weight of preferably 500 to 500,000, more preferably 500 to 300,000 in terms of polystyrene.

The non-decomposable polymers (B) may be used alone or in combination of two or more.

The amount of the component (B) is preferably 10 to 90 parts by weight, more preferably 20 to 90 parts by weight, particularly preferably 20 to 70 parts by weight based on 100 parts by weight of the total of the components (A) and (B). When the amount of the component (B) is smaller than 10 parts by weight, the obtained refractive index changing material is apt to be brittle and when the amount is larger than 90 parts by weight, the obtained refractive index difference tends to be small.

(C) Radiation Sensitive Decomposer

The radiation sensitive decomposer (C) used in the present invention can be a radiation sensitive acid generating agent or a radiation sensitive base generator. In this case, it is preferred to use a radiation sensitive acid generator as the radiation sensitive decomposer (C) when an acid decomposable polymer is used as the decomposable polymer (A) and a radiation sensitive base generator as the radiation sensitive decomposer (C) when a base decomposable polymer is used as the decomposable polymer (A).

As the above radiation sensitive acid generator may be used a trichloromethyl-s-triazine, diaryl iodonium salt, triaryl sulfonium salt, quaternary ammonium salt or sulfonic acid ester.

Examples of the trichloromethyl-s-triazine include 2,4,6-tris(trichloromethyl)-s-triazine, 2-phenyl-4,6-bis(trichloromethyl)-s-triazine, 2-(4-chlorophenyl)-4,6-bis(trichloromethyl)-s-triazine, 2-(3-chlorophenyl)-4,6-bis (trichloromethyl)-s-triazine, 2-(2-chlorophenyl)-4,6-bis (trichloromethyl)-s-triazine, 2-(4-methoxyphenyl)-4,6-bis (trichloromethyl)-s-triazine, 2-(3-methoxyphenyl)-4,6-bis (trichloromethyl)-s-triazine, 2-(2-methoxyphenyl)-4,6-bis (trichloromethyl)-s-triazine, 2-(4-methylthiophenyl)-4,6-bis (trichloromethyl)-s-triazine, 2-(3-methylthiophenyl)-4,6-bis (trichloromethyl)-s-triazine, 2-(2-methylthiophenyl)-4,6-bis (trichloromethyl)-s-triazine, 2-(4-methoxynaphthyl)-4,6-bis (trichloromethyl)-s-triazine, 2-(3-methoxynaphthyl)-4,6-bis (trichloromethyl)-s-triazine, 2-(2-methoxynaphthyl)-4,6-bis (trichloromethyl)-s-triazine, 2-(4-methoxy-β-styryl)-4,6-bis (trichloromethyl)-s-triazine, 2-(3-methoxy-β-styryl)-4,6-bis (trichloromethyl)-s-triazine, 2-(2-methoxy-β-styryl)-4,6-bis (trichloromethyl)-s-triazine, 2-(3,4,5-trimethoxy-β-styryl)-4,6-bis(trichloromethyl)-s-triazine, 2-(4-methylthio-β-styryl)-4,6-bis(trichloromethyl)-s-triazine, 2-(3-methylthio-β-styryl)-4,6-bis(trichloromethyl)-s-triazine, 2-(3-methylthio-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine and 2-[2-(4-diethylamino-2-methylphenyl)ethenyl]-4,6-bis(trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyl dimethylsulfonium tetrafluoroborate, 4-hydroxy-1-naphthalenyl dimethylsulfonium hexafluorophosphonate, 4-hydroxy-1-naphthalenyl dimethylsulfonium hexafluoroarsenate, 4-hydroxy-1-naphthalenyl dimethylsulfonium trifluoromethane sulfonate, 4-hydroxy-1-naphthalenyl dimethylsulfonium trifluoroacetate, 4-hydroxy-1-naphthalenyl dimethylsulfonium-p-toluene sulfonate, 4-hydroxy-1-naphthalenyl dimethylsulfonium butyltris(2,6-difluorophenyl)borate, 4-hydroxy-1-naphthalenyl dimethylsulfonium hexyltris(p-chlorophenyl)borate and 4-hydroxy-1-naphthalenyl dimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl)borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p-toluene sulfonate, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri(trifluoromethanesulfonic acid)ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimide-p-toluenesulfonicacidester, N-hydroxynaphthalimide-trifluoromethanesulfonic acid ester, N-hydroxynaphthalimide-methanesulfonic acid ester, N-hydroxy-5-norbornene-2,3-dicarboxyimide-p-toluensulfonic acid ester, N-hydroxy-5-norbornene-2,3-dicarboxyimide-trifluoromethanesulfonic acid ester, N-hydroxy-5-norbornene-2,3-dicarboxyimide-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-4,6-bis(trichloromethyl)-s-triazine, 2-(4-methoxyphenyl)-4,6-bis(trichloromethyl)-s-triazine, 2-(4-methylthiophenyl)-4,6-bis(trichloromethyl)-s-triazine, 2-(4-methoxy-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, 2-[2-(4-diethylamino-2-methylphenyl)ethenyl]-4,6-bis(trichloromethyl)-s-triazine and 2-(4-methoxynaphthyl)-4,6-bis(trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryliodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triarylsulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimide-p-toluenesulfonic acid ester and N-hydroxynaphthalimide-trifluoromethanesulfonic acid ester are preferred as sulfonic acid esters.

What are disclosed by JP-A4-330444, Polymer, pp. 242–248, vol. 46, No. 6 (1997) and U.S. Pat. No. 5,627,010 are advantageously used as the above radiation sensitive base generator. However, the radiation sensitive base generator is not limited to these if it generates a base upon exposure to radiation.

The radiation sensitive base generator in the present invention is preferably an photo active carbamate such as triphenyl methanol, benzyl carbamate or benzoin carbamate; amide such as O-carbamoyl hydroxylamide, O-carbamoyloxime, aromatic sulfonamide, alpha-lactam or N-(2-allylethynyl)amide, or other amide; oxime ester, α-aminoacetophenone or cobalt complex.

Examples of the radiation sensitive base generator include compounds represented by the following formulas (11) to (21):

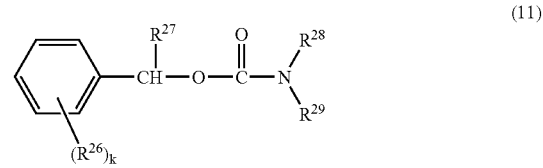

(11)

wherein $R^{26}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxyl group, mercapto group, aryl group, fluorine atom, chlorine atom or bromine atom, k is an integer of 0 to 3, $R^{27}$ is a hydrogen atom, alkyl group having 1 to 6 carbon atoms or aryl group, and $R^{28}$ and $R^{29}$ are each independently a hydrogen atom, alkyl group having 1 to 6 carbon atoms, aryl group or benzyl group, or $R^{28}$ and $R^{29}$ may be bonded together to form a cyclic structure having 5 to 6 carbon atoms,

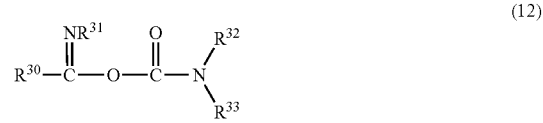

(12)

wherein $R^{30}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxyl group, mercapto group or aryl group, $R^{31}$ is a hydrogen atom, alkyl group having 1 to 6 carbon atoms or aryl group, and $R^{32}$ and $R^{33}$ are each independently a hydrogen atom, alkyl group having 1 to 6 carbon atoms, aryl group or benzyl group, or $R^{32}$ and $R^{33}$ may be bonded together to form a cyclic structure having 5 to 6 carbon atoms,

(13)

wherein $R^{34}$ is an alkyl group having 1 to 6 carbon atoms or aryl group, and $R^{35}$ and $R^{36}$ are each independently a hydrogen atom, alkyl group having 1 to 6 carbon atoms, aryl group or benzyl group, or $R^{35}$ and $R^{36}$ may be bonded together to form a cyclic structure having 5 to 6 carbon atoms,

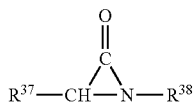
(14)

wherein $R^{37}$ and $R^{38}$ are each independently an alkyl group having 1 to 6 carbon atoms or aryl group,

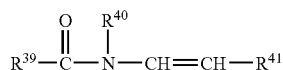
(15)

wherein $R^{39}$, $R^{40}$ and $R^{41}$ are each independently an alkyl group having 1 to 6 carbon atoms or aryl group,

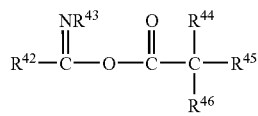
(16)

wherein $R^{42}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{43}$ is a hydrogen atom, alkyl group having 1 to 6 carbon atoms or aryl group, and $R^{44}$, $R^{45}$ and $R^{46}$ are each independently a hydrogen atom, alkyl group having 1 to 6 carbon atoms, aryl group or benzyl group,

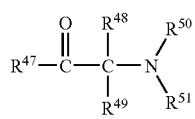
(17)

wherein $R^{47}$ is an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{48}$ and $R^{49}$ are each independently a hydrogen atom, hydroxyl group, mercapto group, cyano group, phenoxy group, alkyl group having 1 to 6 carbon atoms, fluorine atom, chlorine atom, bromine atom or aryl group, and $R^{50}$ and $R^{51}$ are each independently a hydrogen atom, alkyl group having 1 to 6 carbon atoms, aryl group or benzyl group, or $R^{50}$ and $R^{51}$ may be bonded together to form a cyclic structure having 5 to 6 carbon atoms,

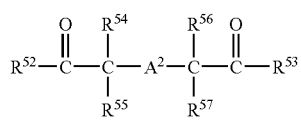
(18)

wherein $R^{52}$ and $R^{53}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{54}$ to $R^{57}$ are each independently a hydrogen atom, hydroxyl group, mercapto group, cyano group, phenoxy group, alkyl group having 1 to 6 carbon atoms, fluorine atom, chlorine atom, bromine atom or aryl group, and $A^2$ is a group of divalent atoms formed by excluding two hydrogen atoms bonded to one or two nitrogen atoms of a monoalkylamine, piperazine, aromatic diamine or aliphatic diamine,

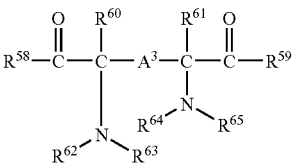
(19)

wherein $R^{58}$ and $R^{59}$ are each independently an alkyl group having 1 to 6 carbon atoms, alkoxy group having 1 to 6 carbon atoms, thioalkyl group having 1 to 6 carbon atoms, dialkylamino group having 1 to 6 carbon atoms, piperidyl group, nitro group, hydroxy group, mercapto group or aryl group, $R^{60}$ and $R^{61}$ are each independently a hydrogen atom, hydroxyl group, mercapto group, cyano group, phenoxy group, alkyl group having 1 to 6 carbon atoms, fluorine atom, chlorine atom, bromine atom or aryl group, $R^{62}$ to $R^{65}$ are each independently a hydrogen atom, alkyl group having 1 to 6 carbon atoms, aryl group or benzyl group, or $R^{62}$ and $R^{63}$ or $R^{64}$ and $R^{65}$ may be bonded together to form a cyclic structure having 5 to 6 carbon atoms, and $A^3$ is an alkylene group having 1 to 6 carbon atoms, cyclohexylene group, phenylene group or single bond,

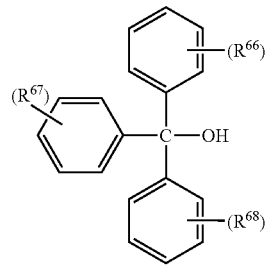
(20)

wherein $R^{66}$ to $R^{68}$ are each independently a hydrogen atom, fluorine atom, chlorine atom, bromine atom, alkyl group having 1 to 6 carbon atoms, alkenyl group having 1 to 6 carbon atoms, alkynyl group having 1 to 6 carbon atoms, alkoxy group having 1 to 6 carbon atoms or aryl group, $$L_n \cdot Co^{3+} \cdot 3[(R^{69})_3 R^{70}]^- \quad (21)$$

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, n is an integer of 2 to 6, $R^{69}$ is an aryl group, and $R^{70}$ is an alkyl group having 1 to 18 carbon atoms.

In all the above formulas (11) to (21), the alkyl group may be linear, branched or cyclic. The aryl group includes an alkenyl group such as vinyl or propylenyl; alkynyl group such as acetylenyl; phenyl group, naphthyl group and anthracenyl group, and also those obtained by substituting a fluorine atom, chlorine atom, bromine atom, haloalkyl group, hydroxyl group, carboxyl group, mercapto group, cyano group, nitro group, azido group, dialkylamino group, alkoxy group or thioalkyl group for the hydrogen atoms of the above groups.

Out of these radiation sensitive base generating agents, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexamminecobalt(III) tris(triphenylmethylborate) and 2-benzyl-2-dimethylamino-1-(4-morpholinophenyl)-butanone.

The above radiation sensitive decomposer (C) is preferably used in an amount of 0.01 part or more by weight, more preferably 0.05 part or more by weight based on 100 parts by weight of the total of the decomposable compound (A) and the non-decomposable compound (B). When the amount of the component (C) is smaller than 0.01 part by weight, sensitivity to radiation tends to lower. The upper limit value is preferably 30 parts by weight, more preferably 20 parts by weight.

(D) Stabilizer

The stabilizer (D) used in the present invention has the function of stabilizing the residual decomposable compound (A) existent in the refractive index changing material after exposure to radiation to provide stability to an acid or base. This stabilization prevents a change in the refractive index and hence the deterioration of a refractive index pattern formed by the method of the present invention even when it is used under the condition that light having a wavelength close to the wavelength used to change the refractive index passes therethrough.

The above stabilizer (D) is selected from an amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound, silyl halide compound, other silyl compound, imidazole compound and amine-terminated dendrimer compound.

Examples of the above amino compound include triethylamine, tripropylamine, tributylamine, tripentylamine, trihexylamine, tricyclohexylamine, triphenylamine, tribenzylamine, aniline, ethylenediamine, diethylenetriamine, triethylenetetramine, tetraethylenepentamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,4-diaminocyclohexane, 1,3-cyclohexanebis(methylamine), 1,3-propane-2-ol, 2,2',2''-triaminotriethylamine, 1,4-diamino-2,2,3,3-tetrafluoropentane, 1,5-diamino-2,2,3,3,4,4-hexafluoropentane, melamine, benzoguanamine, acetoguanamine, acryloguanamine, paramine, amidol, m-phenylenediamine, p-phenylenediamine, p,p'-diaminodiphenylmethane, diaminodiphenylsulfone, 1,8-diaminonaphthalene, 3,5-diamino-1,2,4-triazole, 2-chloro-4,6-diamino-S-triazine, 2,6-diaminopyridine, 3,3'-diaminobenzidine, bis(4-aminophenyl)ether, m-xylylenediamine, p-xylylenediamine, 1,2,4,5-benzenetetramine, 2,4-diamino-1,3,5-triazine, 4,4'-diaminobenzophenone, 3,3',4,4'-tetraaminobenzophenone, triaminobenzene, 4,4'-thiodianiline, 2,3,5,6-tetrabromo-p-xylylenediamine, 2,3,5,6-tetrachloro-p-xylylenediamine, 4,5-methylenedioxy-1,2-phenylenediamine and 2,2'-bis(5-aminopyridyl) sulfide.

Examples of the above epoxy compound include bisphenol A epoxy resin, bisphenol F epoxy resin, phenol novolak epoxy resin, cresol novolak epoxy resin, cyclic aliphatic epoxy resin, bisphenol A epoxy compound and aliphatic polyglycidyl ether.

Examples of commercially available products of the above compounds are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenol F epoxy resin include Epicoat 807 (of Yuka Shell Epoxy Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177 and CY179 (of CIBA-GEIGYA.G.), ERL-4234, ERL-4299, ERL-4221 and ERL-4206 (of U.C.C. Co., Ltd.), Showdyne 509 (of Showa Denko K.K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell Epoxy Co., Ltd.) and ED-5661 and ED-5662 (of Ceranies Coating Co., Ltd.), and those of the aliphatic polyglycidyl ether include Epolite 100MF (of Kyoeisha Kagaku Co., Ltd.) and Epiol TMP (of NOF Corporation).

Besides the above compounds, phenylglycidyl ether, butylglycidyl ether, 3,3,3-trifluoromethylpropylene oxide, styrene oxide, hexafluoropropylene oxide, cyclohexene oxide, N-glycidylphthalimide, (nonafluoro-N-butyl)epoxide, perfluoroethylglycidyl ether, epichlorohydrin, epibromohydrin, N,N-diglycidylaniline and 3-[2-(perfluorohexyl)ethoxy]-1,2-epoxypropane may be advantageously used as an epoxy compound.

Examples of the above thiirane compound are those obtained by substituting the epoxy groups of the above epoxy compounds with an ethylene sulfide group as shown in J. Org. Chem., 28, 229 (1963), for example.

Examples of the above oxetane compound include bis[(3-ethyl-3-oxetanylmethoxy)methyl]benzene (trade name of XDO, of Toagosei Chemical Industry Co., Ltd.), bis[(3-ethyl-3-oxetanylmethoxy)methyl-phenyl]methane, bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl] hexafluoropropane, tri[(3-ethyl-3-oxetanylmethoxy)methyl]benzene and tetra[(3-ethyl-3-oxetanylmethoxy)methyl]benzene.

The above alkoxymethyl melamine compound, alkoxymethyl benzoguanamine compound, alkoxymethyl glycoluril compound and alkoxymethyl urea compound are obtained by substituting the methylol groups of a methylol melamine compound, methylol benzoguanamine compound, methylol glycoluril compound and methylol urea compound with an alkoxymethyl group, respectively. The type of the alkoxymethyl group is not particularly limited, as exemplified by methoxymethyl group, ethoxymethyl group, propoxymethyl group and butoxymethyl group.

Commercially available products of the above compounds include Cymel 300, 301, 303, 370, 325, 327, 701, 266, 267, 238, 1141, 272, 202, 1156, 1158, 1123, 1170 and 1174, and UFR65 and 300 (of Mitsui Cyanamide Co., Ltd.), and Nicalack Mx-750, Mx-032, Mx-706, Mx-708, Mx-40, Mx-31, Ms-11 and Mw-30 (of Sanwa Chemical Co., Ltd.).

Examples of the above isocyanate compound include phenylene-1,3-diisocyanate, phenylene-1,4-diisocyanate, 1-methoxyphenylene-2,4-diisocyanate, 1-methylphenylene-2,4-diisocyanate, 2,4-tolylene diisocyanate, 2,6-tolylene diisocyanate, 1,3-xylylene diisocyanate, 1,4-xylylene diisocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2,4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1,5-diisocyanate, cyclobutylene-1,3-diisocyanate, cyclopentylene-1,3-diisocyanate, cyclohexylene-1,3-diisocyanate, cyclohexylene-1,4-diisocyanate, 1-methylcyclohexylene-2,4-diisocyanate, 1-methylcyclohexylene-2,6-diisocyanate, 1-isocyanate-3,3,5-trimethyl-5-isocyanate methylcyclohexane, cyclohexane-1,3-bis(methylisocyanate), cyclohexane-1,4-bis(methylisocyanate), isophorone diisocyanate, dicyclohexylmethane-2,4'-diisocyanate, dicyclohexylmethane-4,4'-diisocyanate, ethylene diisocyanate, tetramethylene-1,4-diisocyanate, hexamethylene-1,6-diisocyanate, dodecamethylene-1,12-diisocyanate, lysine diisocyanate methyl ester and prepolymers having an isocyanate group at both terminals obtained from a reaction between a stoichiometrically excessive amount of an organic diisocyanate thereof and a bifunctional active hydrogen-containing compound.

The above diisocyanate may be used in combination with an organic polyisocyanate having 3 or more isocyanate groups, such as phenyl-1,3,5-triisocyanate, diphenylmethane-2,4,4'-triisocyanate, diphenylmethane-2,5,4'-triisocyanate, triphenylmethane-2,4',4''-triisocyanate, triphenylmethane-4,4',4''-triisocyanate, diphenylmethane-2,4,2',4'-tetraisocyanate, diphenylmethane-2,5,2',5'-tetraisocyanate, cyclohexane-1,3,5-triisocyanate, cyclohexane-1,3,5-tris(methylisocyanate), 3,5-dimethylcyclohexane-1,3,5-tris(methylisocyanate), 1,3,5-trimethylcyclohexane-1,3,5-tris(methylisocyanate), dicyclohexylmethane-2,4,2'-triisocyanate or dicyclohexylmethane-2,4,4'-triisocyanate, or an isocyanate terminated prepolymer obtained from a reaction between a stoichiometrically excessive amount of an organic polyisocyanate having 3 or more isocyanate groups and a polyfunctional active hydrogen-containing compound having a 2 or more active hydrogen atoms.

Examples of the above cyanate compound include 1,3-dicyanatobenzene, 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 2,2'- or 4,4'-dicyanatobiphenyl, bis(4-cyanatophenyl)methane, 2,2-bis(4-cyanatophenyl)propane, 2,2'-bis(3,5-dichloro-4-cyanatophenyl)propane, 2,2-bis(4-cyanatophenyl)ethane, bis(4-cyanatophenyl)ether, bis(4-cyanatophenyl)thioether, bis(4-cyanatophenyl)sulfone, 1,1,1,3,3,3-hexafluoro-2,2-bis(4-cyanatophenyl)propane, tris(4-cyanatophenyl)phosphite, tris(4-cyanatophenyl)phosphate and a polynuclear benzene compound having a plurality of isocyanate groups obtained from a reaction between a phenol resin and a cyan halide (for example, JP-B 45-11712 and JP-B 55-9433) (the term "JP-B" as used herein means an "examined Japanese patent publication"). A divalent cyanic acid ester compound derived from a bisphenol such as 2,2-bis(4-cyanatophenyl) propane is particularly preferred because it is easily acquired, has excellent moldability and provides favorable properties to the final cured product. A polycyanate obtained by reacting an initial condensate of a phenol and formaldehyde with a cyan halide is also useful.

Examples of the above oxazoline compound include 2,2'-bis(2-oxazoline), 4-furan-2-ylmethylene-2-phenyl-4H-oxazol-5-one, 1,4-bis(4,5-dihydro-2-oxazolyl)benzene, 1,3-bis(4,5-dihydro-2-oxazolyl)benzene, 2,3-bis(4-isopropenyl-2-oxazolin-2-yl)butane, 2,2'-bis-4-benzyl-2-oxazoline, 2,6-bis(isopropyl-2-oxazolin-2-yl)pyridine, 2,2'-isopropylidenebis(4-tert-butyl-2-oxazoline), 2,2'-isopropylidenebis(4-phenyl-2-oxazoline), 2,2'-methylenebis(4-tert-butyl-2-oxazoline) and 2,2'-methylenebis(4-phenyl-2-oxazoline).

Examples of the above oxazine compound include 2,2'-bis(2-oxazine), 4-furan-2-ylmethylene-2-phenyl-4H-oxazyl-5-one, 1,4-bis(4,5-dihydro-2-oxazyl)benzene, 1,3-bis(4,5-dihydro-2-oxazyl)benzene, 2,3-bis(4-isopropenyl-2-oxazin-2-yl)butane, 2,2'-bis-4-benzyl-2-oxazine, 2,6-bis(isopropyl-2-oxazin-2-yl)pyridine, 2,2'-isopropylidenebis(4-tert-butyl-2-oxazine), 2,2'-isopropylidenebis(4-phenyl-2-oxazine), 2,2'-methylenebis(4-tert-butyl-2-oxazine) and 2,2'-methylenebis(4-phenyl-2-oxazine).

Examples of the above silyl halide compound include tetrahalogenosilanes such as tetrachlorosilane, tetrabromosilane, tetraiodosilane, trichlorobromosilane and dichlorodibromosilane, monoalkyltrihalogenosilanes such as methyltrichlorosilane, methyldichlorobromosilane and cyclohexyltrichlorosilane, monoaryltrihalogenosilanes such as phenyltrichlorosilane, naphthyltrichlorosilane, 4-chlorophenyltrichlorosilane and phenyldichlorobromosilane, monoaryloxytrihalogenosilanes such as phenoxytrichlorosilane and phenoxydichlorobromosilane, monoalkoxytrihalogenosilanes such as methoxytrichlorosilane and ethoxytrichlorosilane, dialkyldihalogenosilanes such as dimethyldichlorosilane, methyl(ethyl)dichlorosilane and methyl(cyclohexyl)dichlorosilane, monoalkylmonoaryldihalogenosilanes such as methyl(phenyl)dichlorosilane, diaryldihalogenosilanes such as diphenyldichlorosilane, diaryloxydihalogenosilanes such as diphenoxydichlorosilane, monoalkylmonoaryloxydihalogenosilanes such as methyl(phenoxy)dichlorosilane, monoarylmonoaryloxydihalogenosilanes such as phenyl(phenoxy)dichlorosilane, dialkoxydihalogenosilanes such as diethoxydichlorosilane, monoalkylmonoalkoxydichlorosilanes such as methyl(ethoxy)dichlorosilane, monoarylmonoethoxydichlorosilanes such as phenyl(ethoxy)dichlorosilane, trialkylmonohalogenosilanes such as trimethylchlorosilane, dimethyl(ethyl)chlorosilane and dimethyl(cyclohexyl)chlorosilane, dialkylmonoarylmonohalogenosilanes such as dimethyl(phenyl)chlorosilane, monoalkyldiarylmonohalogenosilanes such as methyl(diphenyl)chlorosilane, triaryloxymonohalogenosilanes such as triphenoxychlorosilane, monoalkyldiaryloxymonohalogenosilanes such as methyl(diphenoxy)chlorosilane, monoaryldiaryloxymonohalogenosilanes such as phenyl(diphenoxy)chlorosilane, dialkylmonoaryloxymonohalogenosilanes such as dimethyl(phenoxy)chlorosilane, diarylmonoaryloxymonohalogenosilanes such as diphenyl(phenoxy)chlorosilane, monoalkylmonoarylmonoaryloxymonohalgenosilanes such as methyl(phenyl)(phenoxy)chlorosilane, triethoxymonohalogenosilanes such as triethoxychlorosilane, and oligomers thereof such as dimer, trimer, tetramer and pentamer of tetrachlorosilane.

Examples of the above other silyl compound include hexamethyldisilazane, t-butyldimethylchlorosilane, bis(trimethylsilyl)trifluoroacetamide, diethylaminotrimethylsilane, trimethylsilanol, hexamethyldisiloxane, chloromethyldimethylethoxysilane, acetyltriphenylsilane, ethoxytriphenylsilane, triphenylsilanol, triethylsilanol, tripropylsilanol, tributylsilanol, hexaethyldisiloxane, trimethylmethoxysilane, trimethylethoxysilane, triethylmethoxysilane, triethylethoxysilane, acetoxyethyldimethylchlorosilane, 1,3-bis(hydroxybutyl)tetramethyldisiloxane, 1,3-bis(hydroxypropyl)tetramethyldisiloxane, γ-aminopropylmethoxysilane, γ-aminopropylethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, γ-anilinopropyltrimethoxysilane, γ-dibutylaminopropyltrimethoxysilane, γ-ureidopropyltriethoxysilane, N-β(N-vinylbenzylaminoethyl)-γ-aminopropyltrimethoxysilane-hydrochlorate, γ-methacryloxypropyltrimethoxysilane, γ-methacryloxypropyltriethoxysilane, vinyltrimethoxysilane, vinyltriethoxysilane, vinyltrichlorosilane, vinyltris(β-methoxyethoxy)silane, γ-glycidoxypropylmethyldiethoxysilane, γ-glycidoxypropyltriethoxysilane, γ-(3,4-epoxycyclohexyl)ethyltrimethoxysilane, γ-glycidoxypropyltrimethoxysilane, γ-mercaptopropyltrimethoxysilane, γ-chloropropyltrimethoxysilane, trimethylchlorosilane, hexamethyldisilazane, N-trimethylsilylimidazole, bis(trimethylsilyl)urea, trimethylsilylacetamide, bistrimethylsilylacetamide, trimethylsilylisocyanate, trimethylmethoxysilane, trimethylethoxysilane, methyltrimethoxysilane, methyltriethoxysilane, dimethyldimethoxysilane, dimethyldiethoxysilane, t-butyldimethylchlorosilane, t-butyldiphenylchlorosilane, triisopropylchlorosilane, n-propyltrimethoxysilane, isobutyltrimethoxysilane, n-hexyltrimethoxysilane, n-decyltrimethoxysilane, n-hexadecyltrimethoxysilane, 1,6-bis(trimethoxysilyl)hexane, dimethylsilyldiisocyanate, methylsilyltriisocyanate, phenyltrimethoxysilane, diphenyldimethoxysilane and phenylsilyltriisocyanate.

Examples of the above imidazole compound include imidazole, 1-methylimidazole, 2-methylimidazole, 4-methylimidazole, 1-ethylimidazole, 2-ethylimidazole, 4-ethylimidazole, 1-propylimidazole, 2-propylimidazole, 4-propylimidazole, 1-butylimidazole, 2-butylimidazole, 4-butylimidazole, 1-cyclohexylimidazole, 2-cyclohexylimidazole, 4-cyclohexylimidazole, 1-ethyleneimidazole, 2-ethyleneimidazole, 4-ethyleneimidazole, 2-methyl-4-methylimidazole, 2-ethyl-4-methylimidazole, 2-methyl-4-ethylimidazole, 2-ethyl-4-ethylimidazole, 2-ethylene-4-ethylimidazole, 2-ethyl-4-ethyleneimidazole, 1-phenylimidazole, 2-phenylimidazole, 4-phenylimidazole and N-(3-aminopropyl)imidazole.

The above amine terminated dendrimer compound is a branched polymer having regular tree-like branches which is detailed in, for example, Angew. Chem. Int. Ed. Engl., 29, 138 (1990), Kagaku (chemistry), 50, 608 (1995) and the like, and may have an amino group at a terminal. The structure of the dendrimer skeleton is not particularly limited but may be an aliphatic skeleton such as aliphatic polyamide-amine, aliphatic polyamine, aliphatic polyester, aliphatic polyamide or aliphatic polyether, or aromatic skeleton such as aromatic polyamide-amine, aromatic polyamine, aromatic polyester, aromatic polyamide, aromatic polyether, polyphenylene, polyphenylacetylene or polyphenylene vinylene. Commercially available products of the above dendrimer compound include the Starburst (registered trademark) polyamide-amine (PAMAM) dendrimer compounds having ethylene diamine as a core and generations 0 to 4 (of Aldrich Co., Ltd.).

Out of these, the stabilizer (D) used in the present invention is preferably an amino compound, epoxy compound, thiirane compound, oxetane compound, oxazoline compound, oxazine compound, silyl compound, isocyanate compound and cyanate compound, more preferably an amino compound, epoxy compound, thiirane compound, oxetane compound, oxazoline compound or oxazine compound. It is particularly preferably ethylenediamine, phenylglycidyl ether, 3-phenoxypropylene sulfide, 3,3,3-trifluoropropylene oxide, hexamethyldisilazane, γ-aminopropylmethoxysilane, γ-glycidoxypropyltrimethoxysilane or methylsilyltriisocyanate.

These stabilizers (D) may be used alone or in combination of two or more. The amount of the component (D) may be excessive so that the residual decomposable polymer (A) can react to the full but it is generally 10 parts or more by weight, preferably 30 parts or more by weight based on 100 parts by weight of the component (A). When the amount of the component (D) is smaller than 10 parts by weight, the stability of the refractive index changing material may become unsatisfactory due to an incomplete reaction.

A catalyst may be used in combination with the stabilizer (D). Use of the catalyst promotes a reaction between the component (D) and the residual decomposable compound (A).

The catalyst is an acid catalyst, base catalyst or quaternary onium salt.

Examples of the acid catalyst include organic acids such as acetic acid, methanesulfonic acid, p-toluenesulfonic acid, trifluoroacetic acid and trifluoromethanesulfonic acid; and inorganic acids such as hydrochloric acid, sulfuric acid and nitric acid. Examples of the base catalyst include alkali metal carbonates such as sodium carbonate, potassium carbonate and lithium carbonate; alkali metal bicarbonates such as sodium bicarbonate, potassium bicarbonate and lithium bicarbonate; alkali metal acetates such as sodium acetate; alkali metal hydrides such as lithium hydride, sodium hydride and potassium hydride; alkali metal hydroxides such as sodium hydroxide, potassium hydroxide and lithium hydroxide; alkali metal alkoxides such as sodium methoxide, sodium ethoxide, potassium t-butoxide and lithium methoxide; mercaptan alkali metals such as methyl mercaptan sodium and ethyl mercaptan sodium; organic amines such as triethylamine, tributylamine, diisopropylethylamine, N-methylmorpholine, pyridine, 4-(N,N-dimethylamino)pyridine, N,N-dimethylaniline, N,N-diethylaniline, 1,5-diazabicyclo[4.3.0]nona-5-ene, 1,4-diazabicyclo[2.2.2]octane (DABCO) and 1,8-diazabicyclo[5.4.0]undec-7-ene (DBU); alkyl lithiums such as methyl lithium, ethyl lithium and butyl lithium; and lithium alkyl amides such as lithium diisopropylamide and lithium dicyclohexylamide. Examples of the above quaternary onium salt include tetrabutylammonium chloride, tetrabutylammonium bromide, tetrabutylammonium iodide, tetrabutylammonium acetate, tetrabutylphosphonium chloride, tetrabutylphosphonium bromide, cetyltrimethylammonium bromide, tetrapropylammonium bromide and benzyltriethylammonium chloride. A combination of 18-crown-6-ether and a salt such as potassium chloride, potassium bromide, potassium iodide, cesium chloride, potassium phenoxide, sodium phenoxide or potassium benzoate may also be used as the catalyst.

Out of these, p-toluenesulfonic acid, hydrochloric acid, sulfuric acid, sodium hydroxide, potassium t-butoxide, triethylamine, DBU, tetrabutylammonium bromide, tetrabutylphosphonium bromide and 18-crown-6-ether/potassium phenoxide are preferred as the catalyst.

The amount of the catalyst is preferably 2 mols or less based on 1 equivalent of the component (D) when an amino compound, alkoxymethyl melamine compound, alkoxymethyl glycoluril compound, alkoxymethyl benzoguanamine compound, alkoxymethyl urea compound or silyl halide compound is used as the component (D).

When an epoxy compound, thiirane compound, oxetane compound, isocyanate compound, cyanate compound, oxazoline compound, oxazine compound or other silyl compound is used as the component (D), it is preferably 0.2 mol or less based on 1 equivalent of the component (D).

The number of equivalents of the component (D) is obtained by multiplying the number of reactive groups contained in the component (D) by the amount (mol) of the component (D) and the number of reactive groups is defined as follows according to the type of the component (D). amino compound: number of nitrogen atoms epoxy compound: number of epoxy groups thiirane compound: number of ethylene sulfide groups oxetane compound: number of oxetanyl groups alkoxymethyl melamine compound, alkoxymethyl glycoluril compound, alkoxymethyl benzoguanamine compound and alkoxymethyl urea compound: number of alkoxymethyl groups isocyanate compound: number of isocyanate groups cyanate compound: number of cyanate groups oxazoline compound: number of oxazolyl groups oxazine compound: number of oxazyl groups silyl halide compound: number of halogen atoms bonded to silicon atoms other silyl compound: number of silicon atoms <Other Components>

The refractive index changing material used in the present invention may contain other additives in limits not prejudicial to the object of the present invention. The additives include an ultraviolet light absorber, sensitizer, surfactant, heat resistance improving agent and adhesive aid.

The above ultraviolet light absorber is a benzotriazole, salicylate, benzophenone, substituted acrylonitrile, xanthene, coumarin, flavone or chalcone. Specific examples of the ultraviolet light absorber include Tinubin 234 (2-(2-hydroxy-3,5-bis(α,α-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl) propionate and polyethylene glycol (molecular weight of 300)) of Ciba Specialty Chemicals Co., Ltd., 1,7-bis(4-hydroxy-3-methoxyphenyl)-1,6-heptadiene-3,5-dione, and dibenzylidene acetone.

By adding an ultraviolet light absorber, the amount of an acid or base formed from the component (C) can be made gradually smaller as the depth from the surface of an exposed portion of the refractive index changing material of the present invention increases, which is useful as means of forming GRIN. The amount of the ultraviolet light absorber is preferably 30 parts or less by weight, more preferably 20 parts or less by weight based on 100 parts by weight of the total of the components (A) and (B).

The above sensitizer is, for example, a coumarin having a substituent at the 3-position and/or 7-position, flavone, dibenzalacetone, dibenzalcyclohexane, chalcone, xanthene, thioxanthene, porphyrin, phthalocyanine, acridine or anthracene.

The amount of the sensitizer is preferably 30 parts or less by weight, more preferably 20 parts or less by weight based on 100 parts by weight of the total of the components (A) and (B).

The above surfactant may be added to improve coatability, for example, prevent striation or improve developability.

Examples of the surfactant include nonionic surfactants such as polyoxyethylene alkyl ethers including polyoxyethylene lauryl ether, polyoxyethylene stearyl ether and polyoxyethylene oleyl ether, polyoxyethylene aryl ethers including polyoxyethylene octylphenyl ether and polyoxyethylene nonylphenyl ether, and polyethylene glycol dialkyl esters including polyethylene glycol dilaurate and polyethylene glycol distearate; fluorinated surfactants which are commercially available products such as F Top EF301, EF303 and EF352 (of Shin Akita Kasei Co., Ltd.), MegafacF171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); and other surfactants which are commercially available products such as organosiloxane polymer (KP431 of Shin-Etsu Chemical Co., Ltd.) and acrylic or methacrylic acid-based (co)polymer (Polyflow No. 57 and No. 95 of Kyoeisha Kagaku Co., Ltd.).

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyvalent acrylate.

An antistatic agent, keeping stabilizer, halation inhibitor, anti-foaming agent, pigment and heat acid generator may be further added to the refractive index changing material used in the present invention as required.

<Formation of Refractive Index Pattern>

In the present invention, a refractive index pattern can be formed from the above refractive index changing composition as follows, for example.

First, the refractive index changing composition is dissolved or dispersed in a solvent to prepare a composition having a solid content of 5 to 70 wt %. The composition may be filtered with a filter having an opening diameter of about 0.1 to 10 μm as required before use.

Thereafter, this composition is applied to the surface of a substrate such as a silicon wafer and heated (to be referred to as "prebaked" hereinafter) to remove the solvent so as to form a coating film of the refractive index changing composition. The parts of the formed coating film is then exposed to radiation through a pattern mask and heated to create a refractive index difference between exposed and unexposed portions of the refractive index changing composition.

An acid or base is formed from the radiation sensitive decomposer (C) by the above exposure to act on the component (A) so as to decompose it. This decomposed product dissipates at the time of heating after exposure. As a result, there exists a difference in refractive index between exposed and unexposed portions.

At the time of heating, the residual component (A) which did not react with the acid or base reacts with the component (D) to stabilize the formed refractive index pattern.

The solvent used for the refractive index changing composition used in the present invention uniformly dissolves or disperses the above components (A), (B), (C), (D) and other optionally added additives and does not react with these components.

Examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propylmethoxyacetate, butylmethoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate; and fluorine atom-containing solvents such as trifluoromethyl benzene, 1,3-bis(trifluoromethyl)benzene, hexafluorobenzene, hexafluorocyclohexane, perfluorodimethyl cyclohexane, perfluoromethyl cyclohexane, octafluorodecalin and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The refractive index changing composition used in the present invention is formed into various shapes in consideration of application purpose before exposure to radiation. For example, it is formed like a rod, fiber, long plate, sphere, film or lens and the present invention is not limited to these. A commonly used method may be used to mold the refractive index changing composition of the present invention. For example, injection molding, compression molding, blow molding, extrusion, in-case frame polymerization, shaving, drawing, heating/cooling, CVD deposition, sintering or scanning is employed. Spin coating, slitting, bar coating, solvent casting, LB, spraying, roll coating, relief-printing or screen printing may also be used according to the application purpose of an optically molded product.

In this molding process, prebaking is preferably carried out. The prebaking condition which changes according to the composition of the material of the present invention and the type of each additive is preferably 30 to 200% C, more preferably 40 to 150° C. A hot plate or oven, or infrared radiation may be used for heating.

The radiation used for exposure is an i-ray having a wavelength of 365 nm, h-ray having a wavelength of 404 nm, g-ray having a wavelength of 436 nm, ultraviolet ray from a wide-range wavelength light source such as a xenon lamp, far ultraviolet ray such as KrF excimer laser beam having a wavelength of 248 nm or ArF excimer laser beam having a wavelength of 193 nm, X-ray such as synchrotron radiation, charged corpuscular beam such as electron beam, visible ray or a mixture thereof. Out of these, ultraviolet radiation and visible radiation are preferred. The illuminance which depends on the wavelength of the radiation is preferably 0.1 to 100 $mW/cm^2$ because the highest reaction efficiency is obtained. Irradiation of these radiations through a pattern mask makes possible the patterning of the radiation sensitive refractive index changing material. As for patterning accuracy which is affected by a light source used, an optical part having a refractive index variation distribution with a resolution of about 0.2 μm can be produced.

In the present invention, heating (to be referred to as "post-exposure baking (PEB)") is preferably carried out after exposure. A similar device to the above prebaking device may be used for PEB and PEB conditions may be arbitrary. The heating temperature is preferably 30 to 150° C., more preferably 30 to 130° C. Heating for stabilization is preferably carried out continuously after PEB or separately from PEB to react the residual component (A) with the component (D). The heating temperature for stabilization is preferably 35 to 200° C., more preferably a temperature 100° C. or more higher than the PEB temperature, much more preferably a temperature 20° C. or more higher than the PEB temperature.

Further, re-exposure may be carried out to decompose the residual component (C) existent in the unexposed portion and further improve the stability of the material.

The re-exposure may be carried out by the application of radiation having the same wavelength as the radiation used to change the refractive index onto the entire surface of the pattern in the same amount.

Optionally, the stability of the material can be further improved by heating. A similar device to the prebaking device used at the time of molding the material may be used for heating and the heating conditions may be arbitrary.

According to the present invention, the refractive index pattern forming method of the present invention may also be carried out by exposing a refractive index changing composition comprising the above components (A), (B) and (C) to radiation through a pattern mask and treating it with a stabilizer (D).

The treatment with the stabilizer (D) is preferably carried out after post-exposure baking.

The stabilizer (D) has the function of stabilizing the residual decomposable compound (A) existent in the refractive index changing material after exposure to provide stability to an acid or base. This stabilization prevents a change in the refractive index and hence the deterioration of a refractive index pattern formed by the method of the present invention even when it is used under the condition that light having a wavelength close to the wavelength used to change the refractive index passes therethrough.

A low-boiling compound such as ammonia or triethylamine may be used as the stabilizer (D) besides the above examples.

For contact between the refractive index changing composition after exposure to radiation and the stabilizer (D) for stabilization, a suitable method may be employed. For instance, the component (D) and optionally a catalyst are dissolved in a suitable solvent to be contacted to the refractive index changing composition as a solution. Alternatively, when the component (D) is liquid or gas under contact conditions, it may be 100% directly contacted to the refractive index changing composition.

When a solvent is used in the reaction between the above stabilizer (D) and the component (A), the solvent preferably dissolves the component (D) and an optionally added catalyst and does not dissolve the component (A). If the above solvent is selected, the surface of the obtained refractive index pattern will not be roughened.

Examples of the solvent include water; alcohols such as methanol, ethanol, iso-propanol, n-propanol, n-butanol, iso-butanol, tert-butanol, cyclohexanol, ethylene glycol, propylene glycol and diethylene glycol; ethers such as diethyl ether and tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether and propylene glycol ethyl ether; propylene glycol alkyl ether acetates such as propylene glycol methyl ether acetate and propylene glycol ethyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; aliphatic hydrocarbons such as n-hexane, n-heptane and n-octane; ketones such as methyl ethyl ketone, cyclohexanone, methyl isobutyl ketone, methylamyl ketone and 4-hydroxy-4-methyl-2-pentanone; esters such as ethyl acetate, propyl acetate, butyl acetate, ethyl 2-hydroxypropionate, methyl 2-hydroxy-2-methylpropionate, ethyl hydroxyacetate, butyl hydroxyacetate, ethyl lactate, propyl lactate, butyl lactate, methyl 3-hydroxypropionate, methyl 2-hydroxy-3-methylbutanoate, ethyl methoxyacetate, butyl methoxyacetate, ethyl 2-methoxypropionate, butyl 2-methoxypropionate, butyl 2-ethoxypropionate, butyl 2-butoxypropionate, butyl 3-methoxypropionate, butyl 3-ethoxypropionate, butyl 3-propoxypropionate and butyl 3-butoxypropionate; and fluorine atom-containing solvents such as trifluoromethylbenzene, 1,3-bis(trifluoromethyl)benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, water, alcohols, glycol ethers, ethylene glycol alkyl ether acetates and fluorine atom-containing solvents are preferred.

The reaction temperature for carrying out a reaction between the stabilizer (D) and the residual decomposable compound (A) is generally 0 to 130° C., and the reaction time is generally 10 seconds to 1 hour.

Further, re-exposure may be carried out to decompose the residual component (C) existent in the unexposed portion and further improve the stability of the material.

As for what is not described of the refractive index pattern forming method including the above stabilization, it should be understood that the above description of the refractive index pattern forming method is applied directly or with modifications obvious to people having ordinary skill in the art.

Further, according to the present invention, the refractive index pattern forming method of the present invention may also be carried out by exposing the refractive index changing composition comprising the above components (A), (B) and (C) to radiation through a pattern and heating to decompose the decomposable compound (A) of an unexposed portion.

The above heating is preferably carried out at a temperature 10° C. or more higher than the PEB temperature, for example, preferably 170° C. or more, more preferably 200° C. or more.

By the above heating, the residual decomposable compound (A) existent in the unexposed portion is removed by decomposition or sublimation.

As for what is not described of the above refractive index pattern forming method when the component (D) is not contained, it should be understood that related items out of the above description of the pattern forming method are applied directly or with modifications obvious to people having ordinary skill in the art.

In the refractive index pattern of the present invention formed by any one of the above methods, the refractive index of an exposed portion (first region) is preferably higher than that of an unexposed portion (second region). This difference can be adjusted to a desired value by controlling the types and contents of the components (A) and (B) in the refractive index changing composition used in the present invention. For example, the largest value of refractive index difference can be set to a value larger than 0.02.

Since the refractive index pattern of the present invention does not deteriorate without a change in refractive index even when it is used under the condition that light having a wavelength close to the wavelength used to change the refractive index passes therethrough as described above, it is extremely useful as an optical material for use in the optoelectronic and display fields.

As the refractive index pattern of the present invention has a sufficiently large refractive index difference and the created refractive index difference is stable to light and heat, it is extremely useful as an optical material for use in the optoelectronic and display fields. The refractive index pattern of the present invention is also used in optical parts such as photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

<Method of Producing Optical Parts>

The photo-sensitive refractive index changing composition is formed into various shapes in consideration of application purpose before exposure to radiation.

For example, it is formed like a rod, fiber, long plate, sphere, film or lens and the present invention is not limited to these. A commonly used method may be used to mold the photo-sensitive refractive index changing composition, as exemplified by injection molding, compression molding, blow molding, extrusion, in-case frame polymerization, shaving, drawing, heating/cooling, CVD deposition, sintering and scanning. Spin coating, slitting, bar coating, solvent casting, LB, spraying, roll coating, relief-printing or screen printing may also be used according to the application purpose of an optically molded product.

The radiation used for exposure is an i-ray having a wavelength of 365 nm, h-ray having a wavelength of 404 nm, g-ray having a wavelength of 436 nm, ultraviolet ray from a wide-range wavelength light source such as a xenon lamp, far ultraviolet ray such as KrF excimer laser beam having a wavelength of 248 nm or ArF excimer laser beam having a wavelength of 193 nm, X-ray such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. Irradiation of these radiations through a pattern mask makes possible the patterning of the radiation sensitive refractive index changing composition. As for patterning accuracy which is affected by a light source used, an optical part having a refractive index variation distribution with a resolution of about 0.2 μm can be produced.

In the present invention, heating (to be referred to as "post-exposure baking (PEB)" hereinafter) is preferably carried out after exposure. The heating condition which changes according to the composition of the material of the present invention and the type of each additive is preferably 30 to 200° C., more preferably 40 to 150° C. A hot plate or oven, or infrared radiation may be used for heating.

The difference between the maximum refractive index and the minimum refractive index in the refractive index distribution of an optical part of the present invention can be set to a desired value according to application purpose as described above. It can be set to 0.02 or more, optionally 0.03 or more, 0.05 or more, or 0.08 or more.

As specific examples, the methods of forming a lens, optical waveguide, diffraction grating, hologram element and recording medium will be described in detail.

<Method of Forming a Lens>

The lens of the present invention may be formed by a suitable method, for example, the following method.

(1) Method of Forming a GRIN Lens having Concave Lens Power

A photosensitive refractive index changing composition used for the formation of a lens may be dissolved in a suitable solvent before use. The solvent used may be a solvent having a boiling point of 50 to 200° C. and the solid content of the obtained solution may be 50 to 80%. This solution is formed into a disk having a desired shape by a hot press or the like.

Thereafter, the disk is exposed to light in such a manner that the amount of exposure is large at the center portion of the disk and decreases toward the periphery of the disk and then baked to form a GRIN lens having concave lens power. The exposure device is such as shown in FIG. 1. The diaphragm 2 which can be opened or closed of the exposure device of FIG. 1 is installed in front of a disk sample 1, only parallel rays from the above light source are applied to the sample by gradually opening the closed diaphragm 2, and the shutter speed is adjusted such that the diaphragm 2 is fully opened in 1 second to 5 minutes to achieve the above exposure state.

The PEB conditions include a temperature of 50 to 200° C. and a time of 1 second to 30 minutes.

(2) Method of Forming a GRIN Lens having Convex Lens Power

A similar disk sample to that described above (1) is exposed to light in such a manner that the amount of exposure is large at the periphery of the disk and decreases toward the center of the disk and then baked to form a GRIN lens having convex lens power.

This exposure state can be obtained by inputting light uniformly from the side only while the top and bottom portions of the cylinder are shielded from light. An optical fiber or reflector may be-used for uniform exposure from the side.

The same PEB conditions as (1) above may be employed.

<Method of Forming an Optical Waveguide>

The optical waveguide of the present invention may be formed by a suitable method, for example, the following method.

A photosensitive refractive index changing composition for the formation of an optical waveguide may be dissolved in a suitable solvent before use (solution A). The solvent used may be a solvent having a boiling point of 50 to 200° C. and the solid content of the obtained solution may be 20 to 60%.

Separately from this solution, a composition solution comprising the component (B) and a heat acid generator and/or an photo acid generator is prepared (solution B). The solid content of this solution may be 20 to 60% and a solvent having a boiling point of 50 to 200° C. may be used.

The solution B is first applied to a suitable substrate such as a silicon substrate or glass substrate and then the solvent is removed to form a coating film as thick as 1 to 50 μm. This coating film serves as a lower clad layer. Spin coating or slit coating may be employed to apply the solution B and heating may be carried out at 50 to 150° C. for 1 to 30 minutes to remove the solvent.

Thereafter, the solution A is applied to the lower clad layer formed as described above and then the solvent is removed to form an intermediate layer as thick as 1 to 50 μm. The coating method and the solvent removing conditions may be the same as described above.

Subsequently, the intermediate layer is exposed to light through a photomask for shielding the core portion of a waveguide pattern from light and baked. The unexposed portion serves as a core portion and the exposed portion serves as a side clad layer. The PEB conditions include a temperature of 50 to 200° C. and a time of 1 second to 30 minutes.

The solution B is applied to the above intermediate layer again and then the solvent is removed to form an upper clad layer as thick as 1 to 50 μm, thereby making it possible to form an optical waveguide. Since the obtained optical waveguide contains the heat acid generator in the upper and lower clad layers, an acid slightly formed is diffused at the interfaces between the core layer and the lower clad layer and between the core layer and the upper clad layer. Thereby, the interfaces between the core layer and the clad layers can take such a structure that the refractive index changes gradually in the upper, side and lower portions with the result that a GI type optical waveguide is obtained.

<Method of Forming a Recording Medium>

The recording medium of the present invention may be formed by a suitable method, for example, the following method.

A photosensitive refractive index changing composition for the formation of a recording medium may be dissolved in a suitable solvent before use. The solvent used may be a solvent having a boiling point of 50 to 200° C., and the solid content of the obtained solution may be 5 to 50%.

This solution is applied to a flat plastic substrate having a metal film such as an aluminum film having a thickness of about 60 nm and then the solvent is removed to form a coating film as thick as 0.1 to 10 μm. Spin coating or slit coating may be used to apply the solution, and the solvent can be removed by heating at 50 to 150° C. for 1 to 30 minutes.

Thereafter, this coating film is exposed to light through a photomask having a track pick of 1.6 μm at a pitch width of 0.2 to 0.5 μm and baked to form an optical recording medium. The PEB conditions include a temperature of 50 to 200° C. and a time of 1 second to 30 minutes.

<Method of Forming a Diffraction Grating>

The diffraction grating of the present invention may be formed by a suitable method, for example, the following method.

A photosensitive refractive index changing composition for the formation of a diffraction grating may be dissolved in a suitable solvent before use. The solvent used may be a solvent having a boiling point of 50 to 200° C., and the solid content of the obtained solution may be 20 to 60%.

This solution is applied to the surface of a suitable substrate such as a glass substrate and then the solvent is removed to form a thin coating film as thick as 1 to 50 μm. Spin coating or slit coating may be used to apply the solution, and the solvent can be removed by heating at 50 to 150° C. for 1 to 30 minutes.

This coating film is exposed to light in a slit form and baked to form a diffraction grating. To apply slit-form light, for example, the method shown in FIG. 2 may be employed. FIG. 2 shows that parallel rays reflected by a reflector placed obliquely are applied to a coating film. The coating film is exposed to an interference pattern formed by direct rays and reflected rays. The sample is moved in a direction shown by an arrow in the figure at a speed of 0.1 to 100 μm/min while it is illuminated to form a diffraction grating having a desired cycle of 0.3 μm or more. A fine refractive index distribution can be provided by this method.

Another method of applying slit-form light is to apply a plurality of radial rays to the coating film formed as described above from different directions for interference or to apply them through slits. In either method, a diffraction grating having a desired cycle can be formed by changing the input angle of light or the angle of a mirror.

The above PEB conditions include a temperature of 50 to 200° C. and a time of 1 second to 30 minutes.

<Method of Forming a Hologram Element>

The hologram element of the present invention may be formed by a suitable method, for example, the following method.

A photosensitive refractive index changing composition for the formation of a hologram element may be dissolved in a suitable solvent before use. The solvent used may be a solvent having a boiling point of 50 to 200° C., and the solid content of the obtained solution may be 20 to 60%.

This solution is applied to the surface of a suitable substrate such as a glass substrate and then the solvent is removed to form a thin coating film as thick as 1 to 50 μm. Spin coating or slit coating may be used to apply the solution, and the solvent can be removed by heating at 50 to 150° C. for 1 to 30 minutes.

This coating film is exposed to an interference pattern and baked to form a recording medium (hologram) for holography. That is, signal light passing through a subject to be recorded and reference light directly obtained from the same light source are interfered with each other and applied to the coating film to change its refractive index, thereby making it possible to record an image of the subject on the coating film.

The above PEB conditions include heating at a temperature of 50 to 200° C. and for a time of 1 second to 30 minutes.

EXAMPLES

The following examples are provided for the purpose of further illustrating the present invention but are in no way to be taken as limiting.

The weight average molecular weight in terms of polystyrene of a polymer was measured using the GPC CHROMATOGRAPH SYSTEM-21 of Showa Denko K.K.

Synthesis Examples of component (A)

Synthesis Example 1

72.02 g of hexafluoroglutaric acid and 38.72 g of dimethyldichlorosilane were dissolved in 200 g of N-methylpyrrolidone in a 500-ml three-necked flask in an argon atmosphere. To this solution was added a solution obtained by dissolving 47.46 g of pyridine in 50 g of N-methylpyrrolidone under agitation and cooling with ice in 1 hour. After the end of addition, the reaction solution was heated at 60° C. to carry out polymerization for 24 hours. After the end of polymerization, the reaction solution was injected into 2 liters of methanol for precipitation, dissolved in 200 ml of N-methylpyrrolidone again and re-precipitated with 2 liters of methanol for purification.

The precipitated polymer was separated by filtration and vacuum dried at 50° C. to obtain 82.86 g of a polymer (A-1). The weight average molecular weight of the obtained polymer was 12,300.

Synthesis Example 2 of component (A)

72.02 g of hexafluoroglutaric acid and 34.24 g of ethylene glycol divinyl ether were dissolved in 200 g of tetrahydrofuran in a 500-ml three-necked flask in an argon atmosphere. To this solution was added a solution obtained by dissolving 2.56 g of pyridinium-p-toluenesulfonic acid in 10 g of tetrahydrofuran under agitation in 10 minutes. After the end of addition, the reaction solution was heated at 60° C. to carry out polymerization for 24 hours. After the end of polymerization, the reaction solution was injected into 2 liters of methanol for precipitation, dissolved in 200 ml of N-methylpyrrolidone again and re-precipitated with 2 liters of methanol for purification.

The precipitated polymer was separated by filtration and vacuum dried at 50° C. to obtain 75.21 g of a polymer (A-2). The weight average molecular weight of the obtained polymer was 8,500.

Synthesis Example 3 of Component (A)

63.62 g of 3,3,4,4,5,5,5-heptafluoropentanealdehyde and 500 g of tetrahydrofuran were fed to a 1-liter flask whose inside had been substituted with nitrogen and cooled to −78° C. 0.64 of a boron trifluoride ether complex was added to this mixture and stirred at −78° C. for 48 hours in a nitrogen atmosphere.

0.8 g of acetic anhydride and 0.6 g of pyridine were added in a cooled state to the obtained reaction solution and stirred at −78° C. for 2 hours. The whole reaction solution was concentrated to 100 ml by heating at 60° C. under reduced pressure and continuously injected into 5 liters of ion exchange water in 10 minutes. The precipitate was re-dissolved in 50 g of tetrahydrofuran, purified by re-precipitation with 5 liters of ion exchange water and vacuum dried at 5° C. to obtain 43.31 g of a polymer (A-3). The weight average molecular weight of the obtained polymer was 2,700.

Synthesis Example 4 of Component (A)

100.04 g of 2-(2,2,3,3,4,4,4-heptafluorobutyl)succinic acid and 38.72 g of dimethyldichlorosilane were dissolved in 200 g of N-methylpyrrolidone in a 500-ml three-necked flask in an argon atmosphere. To this solution was added a solution obtained by dissolving 47.46 g of pyridine in 50 g of N-methylpyrrolidone under agitation and cooling with ice in 1 hour. After the end of addition, the reaction solution was heated at 60° C. to carry out polymerization for 24 hours. After the end of polymerization, the reaction solution was injected into 2 liters of methanol for precipitation, dissolved in 200 ml of N-methylpyrrolidone again and re-precipitated with 2 liters of methanol for purification.

The precipitated polymer was separated by filtration and vacuum dried at 5° C. to obtain 109.86 g of a polymer (A-4). The weight average molecular weight of the obtained polymer was 14,200.

Synthesis Example 5 of Component (A)

A solution obtained by dissolving 83.08 g of hexafluoroglutaric acid dichloride in 400 ml of chloroform was fed to a 1-liter three-necked flask in an argon atmosphere, and a solution obtained by dissolving 18.62 g of ethylene glycol and 33.66 g of potassium hydroxide in 200 ml of ion exchange water was added to the obtained solution and stirred to carry out interfacial polycondensation. After 6 hours of the reaction, the reaction solution was purified twice by re-precipitation with a mixed solvent of tetrahydrofuran and methanol.

The precipitated polymer was separated by filtration and vacuum dried at 50° C. to obtain 59.87 g of a polymer (A-5). The weight average molecular weight of the obtained polymer was 16,700.

Synthesis Example 6 of Component (A)

72.02 g of hexafluoroglutaric acid and 72.59 g of 1,4-dibromocyclohexane were dissolved in 300 g of N-methylpyrrolidone in a 1-liter three-necked flask in an argon atmosphere. 181.60 g of 18-crown-6-ether complex and 99.50 g of potassium carbonate were added to the obtained solution. The resulting solution was heated at 60° C. under agitation to carry out polymerization for 24 hours. After the end of polymerization, the reaction solution was injected into 2 liters of methanol for precipitation, dissolved in 200 ml of N-methylpyrrolidone again and re-precipitated with 2 liters of methanol for purification.

The precipitated polymer was separated by filtration and vacuum dried at 50° C. to obtain 73.00 g of a polymer (A-6). The weight average molecular weight of the obtained polymer was 15,300.

Synthesis Example 7 of Component (A)

A solution obtained by dissolving 42.68 g of 3,3,3-trifluoropropylene sulfide in 100 ml of methylene chloride was fed to a 300-ml three-necked flask in an argon atmosphere, and a solution obtained by dissolving 1.0 g of cadmium tartarate in 20 ml of methylene chloride was added to the obtained solution to carry out polymerization at 60° C. for 24 hours. After the end of polymerization, the reaction solution was injected into 2 liters of methanol for precipitation, dissolved in 100 ml of methylene chloride again and re-precipitated with 2 liters of methanol for purification. The precipitated polymer was separated by filtration and vacuum dried at 50° C. to obtain 29.13 g of a polymer (A-7). The weight average molecular weight of the obtained polymer was 5,600.

Synthesis Example 8 of Component (A)

64.51 g of carbonochloridic acid-1,4-butanediyl ester was dissolved in 400 ml of chloroform in a 500-ml three-necked flask in an argon atmosphere, and a solution obtained by dissolving 51.87 g of 1,4-bis(1-hydroxyethyl) cyclohexane and 33.66 g of potassium hydroxide in 200 ml of ion exchange water was added to the obtained solution and stirred to carry out interfacial polycondensation. After 6 hours of the reaction, the reaction solution was purified twice by re-precipitation with a mixed solvent of tetrahydrofuran and methanol.

The precipitated polymer was separated by filtration and vacuum dried at 50° C. to obtain 83.61 g of a polymer (A-8). The weight average molecular weight of the obtained polymer was 23,000.

Synthesis Examples of Component (B)

Synthesis Example 1 of Component (B)

39.66 g of phenyltrimethoxysilane and 24.44 g of diphenyldimethoxysilane were dissolved in 100 g of ethylene glycol ethyl methyl ether in a 1-liter three-necked flask and the obtained solution was heated at 70° C. under agitation with a magnetic stirrer. To this solution was continuously added 5.20 g of ion exchange water in 1 hour. After 4 hours of a reaction at 70° C., the obtained reaction solution was cooled to room temperature. Thereafter, 9.20 g of methanol which was a reaction by-product was distilled off under reduced pressure from the reaction solution. The solid content of the obtained solution of a polymer (B-1) was 32.5% and the weight average molecular weight of the polymer was 1,600.

Synthesis Example 2 of Component (B)

60.07 g of bis(4-aminophenyl)ether and 500 ml of N-methylpyrrolidone were fed to a 1-liter three-necked flask, and 82.8 ml of triethylamine was added to the flask and stirred at room temperature for about 10 minutes. Thereafter, 93.06 g of 4,4'-oxydiphthalic dianhydride was added to the obtained solution and stirred at room temperature for 24 hours. 94 g of acetic anhydride and 24 g of pyridine were added to the resulting solution and stirred at room temperature for 3 hours.

After the end of the reaction, the reaction solution was injected into methanol made acidic with hydrochloric acid, and the precipitate was separated by filtration and vacuum dried for 24 hours to obtain 116.2 g of a polymer (B-2). The weight average molecular weight of the obtained polymer was 23,000.

Synthesis Example 3 of Component (B)

8 g of 2,2'-azobis(2,4-dimethylvaleronitrile) and 200 g of diethylene glycol dimethyl ether were fed to a 500-ml three-necked flask. Thereafter, 20 g of 4-vinylbenzoic acid, 30 g of 4-vinylbenzyl glycidyl ether and 50 g of vinylnaphthalene were fed to the flask, the inside of the flask was substituted with nitrogen, and stirring was started gently. The temperature of the solution was elevated to 70° C. and maintained at that temperature for 3 hours to obtain a solution of a polymer (B-3). The solid content of the obtained polymer solution was 31.5% and the weight average molecular weight of the polymer was 9,600.

Example 1

50 parts by weight of the polymer (A-1) as the component (A), the solution containing the polymer (B-1) (corresponding to 50 parts by weight (solid content) of the polymer (B-1)) as the component (B), 1 part by weight of 2-(4-methoxyphenyl)-4,6-bis(trichloromethyl)-s-triazine as the component (C) and 10 parts by weight of 1,4-bis(2',3'-epoxypropyl)octafluoro-n-butane as the component (D) were dissolved in diethylene glycol ethyl methyl ether to a total solids content of 20%, and the resulting solution was filtered with a membrane filter having an opening diameter of 0.2 μm to prepare a refractive index changing composition.

(1) Formation of a Coating Film

The above solution was applied to a silicon substrate with a spinner and prebaked on a hot plate at 90° C. for 2 minutes to form a 1.0 μm thick coating film.

(2) Formation of a Refractive Index Pattern

The obtained coating film was exposed to 80 mJ/cm$^2$ of radiation at the optimum focusing depth using the NSR1505i6A reduction projection exposure device (of Nikon Corporation, NA=0.45, λ=365 nm). The coating film was then baked at 90° C. for 2 minutes to form a refractive index pattern having a refractive index difference between exposed and unexposed portions. As for the refractive index pattern formed herein, the exposed portion will be referred to as "high-refractive index portion" and the unexposed portion will be referred to as "low-refractive index portion" hereinafter.

(3) Measurement of Refractive Index

The refractive indices of the low-refractive index portion and the high-refractive index portion of the refractive index pattern formed above were measured at 633 nm with the Auto EL IV NIR III ellipsometer (of Rudolf Research Co., Ltd.). The results are shown in Table 1.

(4) Evaluation of Transparency

A refractive index pattern was formed on a glass substrate in the same manner as in (1) and (2) above except that the Corning 1737 glass substrate (of Corning Co., Ltd.) was used in place of the silicon substrate. The exposed portion of the refractive index pattern formed on the glass substrate will be referred to as "high-refractive index portion" and the unexposed portion will be referred to as "low-refractive index portion" hereinafter as well.

Thereafter, the transmissions of the low-refractive index portion and the high-refractive index portion of the refractive index pattern formed on the glass substrate having this refractive index pattern were measured at a wavelength of 400 to 800 nm using the 150-20 double beam spectrophotometer (of Hitachi, Ltd.). The minimum transmissions are shown in Table 1. It can be said that when the minimum transmission exceeds 95%, the transmission is satisfactory and when the minimum transmission is 95% or less, the transmission is unsatisfactory.

(5) Stabilization

The refractive index patterns formed on the silicon substrate and the glass substrate as described above were heated at 120° C. (temperature at which the component (A) does not decompose and the components (A) and (D) react with each other) for 2 minutes.

Then, the entire surfaces of the patterns were re-exposed to 4.5 mW/cm$^2$ of radiation without a filter using the Canon PLA-501F for 1 minute and heated in an oven at 200° C. for 10 minutes to stabilize the refractive index patterns.

(6) Evaluation of Refractive Index and Transparency

The refractive indices of the low-refractive index portion and the high-refractive index portion of the above stabilized refractive index pattern formed on the silicon substrate were measured in the same manner as in (3) above. The results are shown in Table 2.

The transparencies of the low-refractive index portion and the high-refractive index portion of the above stabilized refractive index pattern formed on the glass substrate were measured in the same manner as in (4) above. The results are shown in Table 2.

(7) Re-Exposure and Heating

The entire surfaces of the above stabilized refractive index patterns were exposed to 4.5 mW/cm$^2$ of radiation without a filter using the Canon PLA-501F for 1 minute and then heated in an oven at 200° C. for 10 minutes.

(8) Evaluation of Stability After Re-Exposure and Heating

The refractive indices of the low-refractive index portion and the high-refractive index portion of the re-exposed and heated refractive index pattern formed on the silicon substrate were measured in the same manner as in (3) above to evaluate the stability of refractive index to re-exposure and heating. The results are shown in Table 2.

The transparencies of the low-refractive index portion and the high-refractive index portion of the re-exposed and heated refractive index pattern formed on the glass substrate were measured in the same manner as in (4) above to evaluate the stability of transparency to re-exposure and heating. The results are shown in Table 2.

Example 2

Evaluations were carried out in the same manner as in Example 1 except that 50 parts by weight of the polymer (A-2) was used as the component (A). The results are shown in Table 1 and Table 2.

Example 3

Evaluations were carried out in the same manner as in Example 1 except that 50 parts by weight of the polymer (A-3) was used as the component (A), the dose of radiation and the PEB temperature in the step (2) (formation of refractive index pattern) were changed as shown in Table 1, and the heating temperature in the step (5) was changed as shown in Table 2. The results are shown in Table 1 and Table 2.

Example 4

Evaluations were carried out in the same manner as in Example 1 except that 50 parts by weight of the polymer (A-4) was used as the component (A), 5 parts by weight of N-(2-nitrobenzyloxycarbonyl)pyrrolidine was used as the component (C), and the dose of radiation in the step (2) (formation of refractive index pattern) was changed as shown in Table 1. The results are shown in Table 1 and Table 2.

Example 5

Evaluations were carried out in the same manner as in Example 4 except that 50 parts by weight of the polymer (A-5) was used as the component (A). The results are shown in Table 1 and Table 2.

Example 6

Evaluations were carried out in the same manner as in Example 1 except that the solution containing the polymer (B-2) (corresponding to 50 parts by weight (solid content) of the polymer (B-2)) was used as the component (B) and 10 parts by weight of 2,2'-bis(2-oxazoline) was used as the component (D). The results are shown in Table 1 and Table 2.

Example 7

Evaluations were carried out in the same manner as in Example 1 except that the solution containing the polymer (B-3) (corresponding to 50 parts by weight (solid content) of the polymer (B-3)) was used as the component (B) and 10 parts by weight of 2,2'-bis(2-oxazoline) was used as the component (D). The results are shown in Table 1 and Table 2.

TABLE 1

| | conditions for forming refractive index patter | | optical properties before stabilization | | | |
|---|---|---|---|---|---|---|
| | dose of | PEB | refractive index | | transparency | |
| | radiation (mJ/cm$^2$) | temperature (° C.) | high-refractive index portion | low-refractive index portion | high-refractive index portion | low-refractive index portion |
| Ex. 1 | 80 | 90 | 1.59 | 1.50 | 99.1% | 98.7% |
| Ex. 2 | 80 | 90 | 1.59 | 1.49 | 98.8% | 98.4% |
| Ex. 3 | 50 | 90 | 1.59 | 1.49 | 99.0% | 98.4% |
| Ex. 4 | 150 | 90 | 1.59 | 1.49 | 99.0% | 98.7% |
| Ex. 5 | 150 | 90 | 1.59 | 1.48 | 99.0% | 98.7% |
| Ex. 6 | 80 | 90 | 1.60 | 1.51 | 99.0% | 98.7% |
| Ex. 7 | 80 | 90 | 1.61 | 1.51 | 99.0% | 98.8% |

Ex.: Example

TABLE 2

| | stabilization conditions | optical properties after stabilization | | | |
|---|---|---|---|---|---|
| | treating | refractive index | | transparency | |
| | temperature (° C.) | high-refractive index portion | low-refractive index portion | high-refractive index portion | low-refractive index portion |
| Ex. 1 | 120 | 1.59 | 1.50 | 99.1% | 98.7% |
| Ex. 2 | 120 | 1.59 | 1.49 | 98.8% | 98.4% |
| Ex. 3 | 120 | 1.59 | 1.49 | 99.0% | 98.4% |
| Ex. 4 | 120 | 1.59 | 1.49 | 99.0% | 98.7% |
| Ex. 5 | 120 | 1.59 | 1.48 | 99.0% | 98.7% |
| Ex. 6 | 150 | 1.60 | 1.51 | 99.0% | 98.7% |
| Ex. 7 | 150 | 1.61 | 1.51 | 99.0% | 98.8% |

TABLE 2-continued

| | optical properties after heating by exposure of radiation | | | |
|---|---|---|---|---|
| | refractive index | | transparency | |
| | high-refractive index portion | low-refractive index portion | high-refractive index portion | low-refractive index portion |
| Ex. 1 | 1.59 | 1.50 | 99.1% | 98.7% |
| Ex. 2 | 1.59 | 1.49 | 98.8% | 98.4% |
| Ex. 3 | 1.59 | 1.49 | 99.0% | 98.4% |
| Ex. 4 | 1.59 | 1.49 | 99.0% | 98.7% |
| Ex. 5 | 1.59 | 1.48 | 99.0% | 98.7% |
| Ex. 6 | 1.60 | 1.51 | 99.0% | 98.7% |
| Ex. 7 | 1.61 | 1.51 | 99.0% | 98.8% |

Ex.: Example

Example 8

50 parts by weight of the polymer (A-1) as the component (A), the solution containing the polymer (B-1) (corresponding to 50 parts by weight (solid content) of the polymer (B-1)) as the component (B) and 1 part by weight of 2-(4-methoxyphenyl)-bis(4,6-trichloromethyl)-s-triazine as the component (C) were dissolved in diethylene glycol ethyl methyl ether to a total solids content of 20%, and the resulting solution was filtered with a membrane filter having an opening diameter of 0.2 μm to prepare a solution of a refractive index changing material.

(1) The formation of a coating film, (3) the measurement of refractive index, (4) the evaluation of transparency, (6) the evaluation of refractive index and transparency, (7) re-exposure and heating and (8) the evaluation of stability after re-exposure and heating were carried out in the same manner as in Example 1. (2) The formation of a refractive index pattern and (5) stabilization were carried out as follows. The results are shown in Table 3 and Table 4.

(2) Formation of Refractive Index Pattern

The obtained coating film was exposed to 50 mJ/cm$^2$ of radiation at the optimum focusing depth using the NSR1505i6A reduction projection exposure device (of Nikon Corporation, NA=0.45, λ=365 nm). Then, the coating film was baked at 130° C. for 2 minutes to form a refractive index pattern having a refractive index difference between an exposed portion and an unexposed portion. The exposed portion of the refractive index pattern formed herein will be referred to as "high-refractive index portion" and the unexposed portion will be referred to as "low-refractive index portion" hereinafter.

(5) Stabilization

A 20% dimethylformamide solution of 2,2,3,3,4,4,4-heptafluorobutyloxysilane (containing 10 mol % of tetrabutylammonium bromide) as the component (D) was heated at 100° C. and the refractive index patterns formed on the silicon substrate and the glass substrate as described above were immersed in this solution at 100° C. for 2 minutes and washed with super pure water for 1 minute.

Then, the entire surfaces of the patterns were re-exposed to 4.5 mW/cm$^2$ of radiation without a filter using the Canon PLA-501F for 1 minute and heated in an oven at 200° C. for 10 minutes to stabilize the refractive index patterns.

Example 9

Evaluations were carried out in the same manner as in Example 8 except that 50 parts by weight of the polymer (A-2) was used as the component (A). The results are shown in Table 3 and Table 4.

Example 10

Evaluations were carried out in the same manner as in Example 8 except that 50 parts by weight of the polymer (A-3) was used as the component (A), the dose of radiation and the PEB temperature in the step (2) (formation of refractive index pattern) were changed as shown in Table 3, and the type of the component (D) in the step (5) (stabilization) and the stabilization temperature were changed as shown in Table 4. The results are shown in Table 3 and Table 4.

Example 11

Evaluations were carried out in the same manner as in Example 4 except that 50 parts by weight of the polymer (A-4) was used as the component (A), 5 parts by weight of N-(2-nitrobenzyloxycarbonyl)pyrrolidine was used as the component (C), and the dose of radiation in the step (2) (formation of refractive index pattern) was changed as shown in Table 3. The results are shown in Table 3 and Table 4.

Example 12

Evaluations were carried out in the same manner as in Example 10 except that 50 parts by weight of the polymer (A-5) was used as the component (A). The results are shown in Table 3 and Table 4.

Example 13

Evaluations were carried out in the same manner as in Example 8 except that the solution containing the polymer (B-2) (corresponding to 50 parts by weight (solid content) of the polymer (B-2)) was used as the component (B). The results are shown in Table 3 and Table 4.

Example 14

Evaluations were carried out in the same manner as in Example 8 except that the solution containing the polymer (B-3) (corresponding to 50 parts by weight (solid content) of the polymer (B-3)) was used as the component (B). The results are shown in Table 3 and Table 4.

TABLE 3

| | conditions for forming refractive index patter | | optical properties before stabilization | | | |
|---|---|---|---|---|---|---|
| | dose of radiation (mJ/cm²) | PEB temperature (° C.) | refractive index | | transparency | |
| | | | high-refractive index portion | low-refractive index portion | high-refractive index portion | low-refractive index portion |
| Ex. 8 | 40 | 110 | 1.60 | 1.51 | 99.3% | 99.0% |
| Ex. 9 | 40 | 110 | 1.60 | 1.50 | 98.9% | 98.6% |
| Ex. 10 | 20 | 90 | 1.60 | 1.49 | 99.3% | 98.6% |
| Ex. 11 | 90 | 110 | 1.60 | 1.50 | 99.3% | 99.0% |
| Ex. 12 | 90 | 110 | 1.60 | 1.49 | 99.3% | 99.0% |
| Ex. 13 | 40 | 110 | 1.61 | 1.52 | 99.3% | 99.0% |
| Ex. 14 | 40 | 110 | 1.62 | 1.52 | 99.3% | 99.1% |

Ex.: Example

TABLE 4

| | stabilization conditions | | optical properties after stabilization | | | |
|---|---|---|---|---|---|---|
| | type of component (D) | treating temperature (° C.) | refractive index | | transparency | |
| | | | high-refractive index portion | low-refractive index portion | high-refractive index portion | low-refractive index portion |
| Ex. 8 | D-1 | 100 | 1.60 | 1.49 | 99.3% | 99.0% |
| Ex. 9 | D-1 | 100 | 1.60 | 1.49 | 98.9% | 98.6% |
| Ex. 10 | D-2 | 20 | 1.60 | 1.48 | 99.3% | 98.6% |
| Ex. 11 | D-1 | 100 | 1.60 | 1.48 | 99.3% | 99.0% |
| Ex. 12 | D-1 | 100 | 1.60 | 1.48 | 99.3% | 99.0% |
| Ex. 13 | D-1 | 100 | 1.61 | 1.51 | 99.3% | 99.0% |
| Ex. 14 | D-1 | 100 | 1.62 | 1.51 | 99.3% | 99.1% |

| | optical properties after heating by exposure of radiation | | | |
|---|---|---|---|---|
| | refractive index | | transparency | |
| | high-refractive index portion | low-refractive index portion | high-refractive index portion | low-refractive index portion |
| Ex. 8 | 1.60 | 1.49 | 99.3% | 99.0% |
| Ex. 9 | 1.60 | 1.49 | 98.9% | 98.6% |
| Ex. 10 | 1.60 | 1.48 | 99.3% | 98.6% |
| Ex. 11 | 1.60 | 1.48 | 99.3% | 99.0% |
| Ex. 12 | 1.60 | 1.48 | 99.3% | 99.0% |
| Ex. 13 | 1.61 | 1.51 | 99.3% | 99.0% |
| Ex. 14 | 1.62 | 1.51 | 99.3% | 99.1% |

Ex.: Example

In Table 4, symbols for the component (D) denote the following.
D-1: a 20% dimethylformamide solution of 2,2,3,3,4,4,4-heptafluorobutyloxysilane (containing 10 mol % of tetrabutylammonium bromide)
D-2: 1% aqueous solution of ethylenediamine Example 15

50 parts by weight of the polymer (A-6) as the component (A), the solution containing the polymer (B-1) (corresponding to 50 parts by weight (solid content) of the polymer (B-1)) as the component (B) and 1 part by weight of 2-(4-methoxyphenyl)-4,6-bis(trichloromethyl)-s-triazine as the component (C) were dissolved in diethylene glycol ethyl methyl ether to a total solids content of 20%, and the obtained solution was filtered with a membrane filter having an opening diameter of 0.2 µm to prepare the radiation sensitive refractive index changing composition of the present invention.
(1) The formation of a coating film, (2) the formation of a refractive index pattern, (3) the measurement of refractive index and (4) the evaluation of transparency were carried out in the same manner as in Example 1. The results are shown in Table 5.

Example 16

Evaluations were carried out in the same manner as in Example 15 except that 50 parts by weight of the polymer (A-7) was used as the component (A). The results are shown in Table 5.

Example 17

Evaluations were carried out in the same manner as in Example 15 except that 50 parts by weight of the polymer (A-8) was used as the component (A). The results are shown in Table 5.

Example 18

Evaluations were carried out in the same manner as in Example 15 except that 1 part by weight of 4-phenylthiophenyldiphenylsulfonium trifluoromethane sulfonate was used as the component (C). The results are shown in Table 5.

Example 19

Evaluations were carried out in the same manner as in Example 15 except that 1 part by weight of diphenyliodonium trifluoroacetate was used as the component (C). The results are shown in Table 5.

Example 20

Evaluations were carried out in the same manner as in Example 15 except that 50 parts by weight of the polymer (A-4) was used as the component (A) and 5 parts by weight of 2-benzyl-2-dimethylamino-1-(4-morpholinophenyl)-butanone −1 was used as the component (C). The results are shown in Table 5.

Example 21

Evaluations were carried out in the same manner as in Example 20 except that 5 part by weight of N-(2-nitrobenzyloxycarbonyl)pyrrolidine was used as the component (C). The results are shown in Table 5.

TABLE 5

| | dose of radiation (mJ/cm²) | PEB temperature (° C.) | refractive index | | transparency | |
|---|---|---|---|---|---|---|
| | | | high-refractive index portion | low-refractive index portion | high-refractive index portion | low-refractive index portion |
| Ex. 15 | 40 | 110 | 1.60 | 1.51 | 99.3% | 99.0% |
| Ex. 16 | 100 | 150 | 1.60 | 1.53 | 99.3% | 99.2% |
| Ex. 17 | 50 | 120 | 1.60 | 1.52 | 99.3% | 99.0% |
| Ex. 18 | 50 | 110 | 1.60 | 1.51 | 99.3% | 99.0% |
| Ex. 19 | 60 | 110 | 1.60 | 1.51 | 99.3% | 99.0% |
| Ex. 20 | 90 | 110 | 1.60 | 1.50 | 99.3% | 99.0% |
| Ex. 21 | 110 | 90 | 1.60 | 1.50 | 99.3% | 99.0% |

Ex.: Example

Since the refractive index pattern formed by the method of the present invention has a sufficiently large refractive index difference and the created refractive index difference is stable to light and heat as described above, it is extremely useful as an optical material for use in the optoelectronic and display fields. The refractive index pattern of the present invention is also used in optical materials such as photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

What is claimed is:
1. A radiation sensitive refractive index changing composition comprising (A) a decomposable compound, (B) a non-decomposable compound having a higher refractive index than the decomposable compound (A), (C) a radiation sensitive decomposer and (D) a stabilizer, wherein the decomposable compound (A) contains at least one compound having at least one structure selected from the group consisting of structures represented by the following formulas (1) to (7);

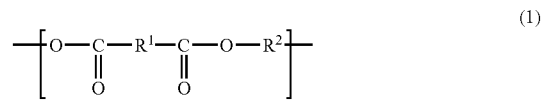

(1)

wherein $R^1$ and $R^2$ are each independently an alkylene group, perfluoroalkylene group or alkylsilylene group, and the alkylene group and the perfluoroalkylene group may contain —O—, —CO—, —COO— or —OCOO— bond,

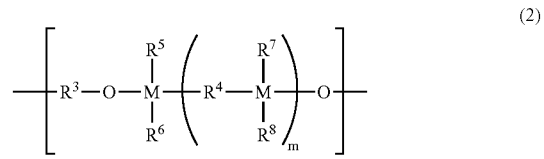

(2)

wherein M is Si or Ge, $R^3$ is an alkylene group or perfluoroalkylene group, $R^4$ is an alkylene group, perfluoroalkylene group, alkylsilylene group or single bond, $R^5$, $R^6$, $R^7$ and $R^8$ are each independently a hydrogen atom, alkyl group, alkoxyl group, alkoxyester group, perfluoroalkyl group, perfluoroalkoxyl group, perfluoroalkoxyester group or perfluoroaryl group, m is an integer of 0 to 2, and the alkylene group or the perfluoroalkylene group may contain —O—, —CO—, —COO— or —OCOO— bond,

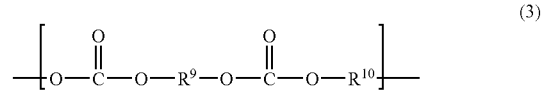

(3)

wherein $R^9$ and $R^{10}$ are each independently an alkylene group or perfluoroalkylene group, the alkylene group or the perfluoroalkylene group may contain —O—, —CO—, —COO— or —OCOO— bond,

(4)

wherein $R^{11}$ is an oxyalkylene group or single bond, and $R^{12}$ is a hydrogen atom, alkyl group, alkoxyl group, alkoxyester group, perfluoroalkyl group, perfluoroalkoxyester group or perfluoroaryl group,

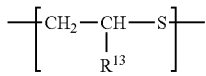 (5)

wherein $R^{13}$ is a hydrogen atom, alkyl group, alkoxyl group, alkoxyester group, perfluoroalkyl group, perfluoroalkoxyl group, perfluoroalkoxyester group or perfluoroaryl group,

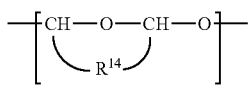 (6)

wherein $R^{14}$ is an alkylene group or a structure represented by the following formula (6)-1, (6)-2 or (6)-3:

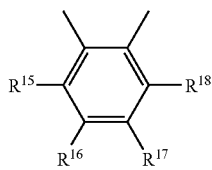 (6)-1 wherein $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms,

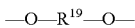 (6)-2 wherein $R^{19}$ is an alkylene group,

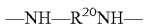 (6)-3 wherein $R^{20}$ is an alkylene group,

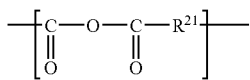 (7)

wherein $R^{21}$ is an alkylene group.

2. The composition of claim 1, wherein the maximum difference between the refractive index of a portion exposed to radiation and the refractive index of a portion unexposed to radiation is 0.02 or more.

3. The composition of claim 1, wherein the relationship between the refractive index $n_B$ of the non-decomposable compound (B) and the refractive index $n_A$ of the decomposable compound (A) satisfies the following expression (1):

$$n_b - n_A \pm 0.05 \quad (1).$$

4. The composition of claim 1, wherein the decomposable compound (A) is an acid decomposable compound, the non-decomposable compound (B) is an acid non-decomposable polymer, and the radiation sensitive decomposer (C) is a radiation sensitive acid generator.

5. The composition of claim 1, wherein the stabilizer (D) is at least one selected from the group consisting of amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound, silyl compound, imidazole compound and amine terminated dendrimer compound.

6. The composition of claim 1 which further contains a catalyst for reacting the decomposable compound (A) with the stabilizer (D).

7. A refractive index pattern forming method comprising exposing a radiation sensitive refractive index changing composition comprising (A) a decomposable compound, (B) a non-decomposable compound having a higher refractive index than the decomposable compound (A), (C) a radiation sensitive decomposer and (D) a stabilizer to radiation and heating to react the stabilizer (D) with the decomposable compound (A) of an unexposed portion.

8. A radiation sensitive refractive index changing composition comprising (A) a decomposable compound, (B) a non-decomposable compound having a higher refractive index than the decomposable compound (A) and (C) a radiation sensitive decomposer, wherein the decomposable compound (A) contains at least one compound having at least one structure selected from the group consisting of structures represented by the following formulas (1) to (7):

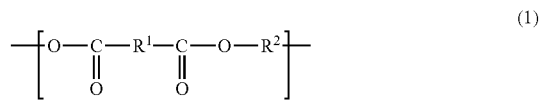 (1)

wherein $R^1$ and $R^2$ are each independently an alkylene group, perfluoroalkylene group or alkylsilylene group, and the alkylene group and the perfluoroalkylene group may contain —O—, —CO—, —COO— or —OCOO— bond,

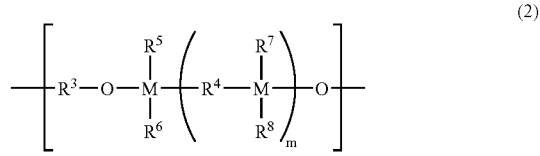 (2)

wherein M is Si or Ge, $R^3$ is an alkylene group or perfluoroalkylene group, $R^4$ is an alkylene group, perfluoroalkylene group, alkylsilylene group or single bond, $R^5$, $R^6$, $R^7$ and $R^8$ are each independently a hydrogen atom, alkyl group, alkoxyl group, alkoxyester group, perfluoroalkyl group, perfluoroalkoxyl group, perfluoroalkoxyester group or perfluoroaryl group, m is an integer of 0 to 2, and the alkylene group or the perfluoroalkylene group may contain —O—, —CO—, —COO— or —OCOO— bond,

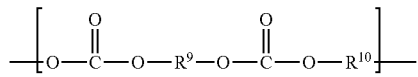
(3)

wherein $R^9$ and $R^{10}$ are each independently an alkylene group or perfluoroalkylene group, the alkylene group or the perfluoroalkylene group may contain —O—, —CO—, —COO— or —OCOO— bond,

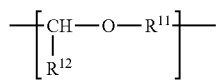
(4)

wherein $R^{11}$ is an oxyalkylene group or single bond, and $R^{12}$ is a hydrogen atom, alkyl group, alkoxyl group, alkoxyester group, perfluoroalkyl group, perfluoroalkoxyester group or perfluoroaryl group,

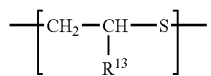
(5)

wherein $R^{13}$ is a hydrogen atom, alkyl group, alkoxyl group, alkoxyester group, perfluoroalkyl group, perfluoroalkoxyl group, perfluoroalkoxyester group or perfluoroaryl group,

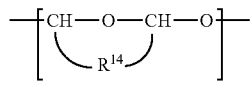
(6)

wherein $R^{14}$ is an alkylene group or a structure represented by the following formula (6)-1, (6)-2 or (6)-3:

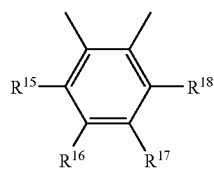
(6)-1 wherein $R^{15}$, $R^{16}$, $R^{17}$ and $R^{18}$ are each indenendently a hydrogen atom, chain aikyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms,

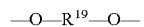
(6)-2 wherein $R^{19}$ is an alkylene group,

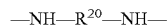
(6)-3 wherein $R^{20}$ is an alkylene group,

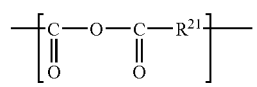
(7)

wherein $R^{21}$ is an alkylene group.

9. A refractive index pattern forming method comprising exposing a refractive index changing composition comprising (A) a decomposable compound, (B) a non-decomposable compound having a higher refractive index than the decomposable compound (A) and (C) a radiation sensitive decomposer to radiation through a pattern mask and heating to decompose the decomposable compound of an unexposed portion.

10. A refractive index pattern forming method comprising exposing a refractive index changing composition comprising (A) a decomposable compound, (B) a non-decomposable compound having a higher refractive index than the decomposable compound (A) and (C) a radiation sensitive decomposer to radiation through a pattern mask and treating the composition with (D) a stabilizer to react the decomposable compound (A) of an unexposed portion with the stabilizer (D).

11. A refractive index pattern formed by the method of claim 7.

12. An optical material having a refractive index pattern formed by the method of claim 7.

13. A refractive index pattern formed by the method of claim 9.

14. A refractive index pattern formed by the method of claim 10.

15. An optical material having a refractive index pattern formed by the method of claim 9.

16. An optical material having a refractive index pattern formed by the method of claim 10.

* * * * *